United States Patent
Atriss et al.

(10) Patent No.: US 8,823,566 B2
(45) Date of Patent: Sep. 2, 2014

(54) ANALOG TO DIGITAL CONVERSION ARCHITECTURE AND METHOD WITH INPUT AND REFERENCE VOLTAGE SCALING

(75) Inventors: Ahmad H Atriss, Gilbert, AZ (US); Steven P. Allen, Chandler, AZ (US); Rakesh Shiwale, Chandler, AZ (US); Mohammad Nizam U. Kabir, Tempe, AZ (US)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 13/537,308

(22) Filed: Jun. 29, 2012

(65) Prior Publication Data

US 2014/0002291 A1    Jan. 2, 2014

(51) Int. Cl.
H03M 1/88    (2006.01)
(52) U.S. Cl.
USPC ........................................... 341/139; 341/155
(58) Field of Classification Search
USPC ................. 341/155, 144, 161, 172, 122, 139
See application file for complete search history.

(56) References Cited

U.S. PATENT DOCUMENTS

| | | | |
|---|---|---|---|
| 5,574,457 A | 11/1996 | Garrity et al. | |
| 5,644,313 A | 7/1997 | Rakers et al. | |
| 6,169,427 B1 | 1/2001 | Brandt | |
| 6,362,770 B1 | 3/2002 | Miller et al. | |
| 6,535,157 B1 | 3/2003 | Garrity et al. | |
| 6,909,393 B2 | 6/2005 | Atriss et al. | |
| 6,967,611 B2 | 11/2005 | Atriss et al. | |
| 7,064,700 B1 * | 6/2006 | Garrity et al. | 341/155 |
| 7,289,052 B1 | 10/2007 | Atris et al. | |
| 7,535,391 B1 * | 5/2009 | Newman et al. | 341/131 |
| 7,589,658 B2 | 9/2009 | Ren et al. | |
| 7,843,232 B2 | 11/2010 | Farhat et al. | |

* cited by examiner

*Primary Examiner* — Peguy Jean Pierre
(74) *Attorney, Agent, or Firm* — The Mason Group Patent Specialists LLC; Valerie M. Davis

(57) ABSTRACT

An analog-to-digital converter stage includes: a comparator and logic circuit having first upper and lower unscaled voltage trip points that are different than upper and lower residue voltage trip points; and a switched capacitor circuit. The comparator and logic circuit is configured prior to an initial residue calculation cycle to compare a magnitude of an unscaled input voltage to the first upper and lower unscaled voltage trip points, to generate an initial output bit, and to generate a voltage scaling and gain control signal. The switched capacitor circuit is configured to sample the unscaled input voltage, to receive a reference voltage, and to receive the voltage scaling and gain control signal for selectively controlling a subset of switches of the switched capacitor circuit to scale the unscaled input voltage sample and reference voltage and generate an initial residue voltage during a single operation of the initial residue calculation cycle.

14 Claims, 12 Drawing Sheets

US 8,823,566 B2

ANALOG TO DIGITAL CONVERSION ARCHITECTURE AND METHOD WITH INPUT AND REFERENCE VOLTAGE SCALING

FIELD

The present disclosure relates generally to analog-to-digital conversion and more particularly to an analog-to-digital conversion architecture and method that provides for input voltage and reference voltage scaling.

BACKGROUND

Digital signal processing has been proven to be very efficient in handling and manipulating large quantities of data. There are many products that are in common use such as wireless devices, digital cameras, motor controllers, automobiles, and toys, to name a few, that rely on digital signal processing to operate. Many of these products continuously receive information such as light intensity, temperature, revolutions per minute, air pressure, and power, for example, which is monitored and used to produce adjustments to the system, thereby maintaining optimum performance. This monitored information is often in the form of an analog signal that must be converted to a representative digital signal. An analog-to-digital converter (ADC) is used to convert the analog signal to the digital signal. In general, the analog-to-digital conversion process comprises periodically sampling the analog signal and converting each sampled signal to a corresponding digital signal.

Many products require ADCs to have the capability of handling both single ended rail-to-rail inputs (e.g., a single signal representing a voltage) and differential rail-to-rail inputs (e.g., complementary signals representing the same voltage). Also, due to pin limitations, the reference voltage used by the ADC may be derived from a main power supply (e.g., $V_{DDA}$, $V_{SSA}$). To satisfy these requirements, existing ADCs contain a separate configurable block that scales and converts the voltage and reference inputs to the desired differential levels and then provides the scaled analog input voltage to a redundant signed digit (RSD) analog-to-digital converter stage to perform an initial residue calculation operation. The presence of this separate scaling process consumes area as well as power.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
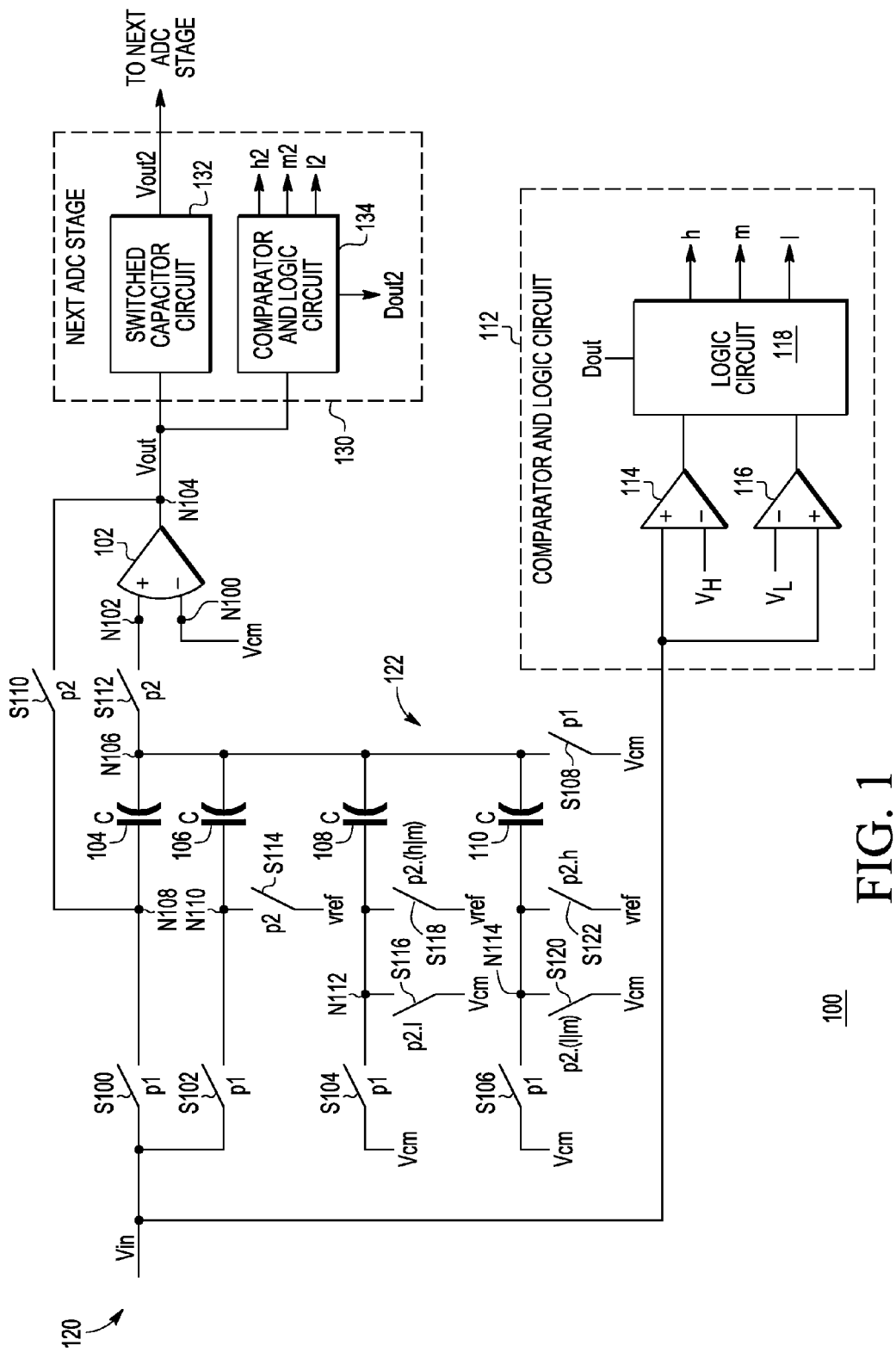
FIG. 1 is a circuit diagram illustrating a portion of an analog-to-digital converter having an ADC stage performing input voltage scaling and an initial residue voltage calculation in the same operation, in accordance with an embodiment.

The present invention is illustrated by way of example and is not limited by the accompanying figures, in which like references indicate similar elements. Skilled artisans will appreciate that elements in the figures are illustrated for simplicity and clarity and have not necessarily been drawn to scale. For example, the dimensions of some of the elements in the figures may be exaggerated relative to other elements to help improve the understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In accordance with an embodiment, an analog-to-digital converter (ADC) stage comprises: a comparator and logic circuit configured with upper and lower unscaled voltage trip points; and a switched capacitor circuit coupled to the comparator and logic circuit. The comparator and logic circuit is configured, prior to an initial residue calculation cycle, to compare a magnitude of an unscaled input voltage to the upper and lower unscaled voltage trip points, to generate an initial output bit corresponding to the magnitude of the unscaled input voltage, and to generate a voltage scaling and gain control signal for use in the initial residue calculation cycle. The switched capacitor circuit comprises of a first voltage input, a voltage output, and a plurality of coupled capacitors and switches configured to sample the unscaled input voltage at the first voltage input to generate an unscaled input voltage sample and to receive the voltage scaling and gain control signal for selectively controlling a subset of the switches in order to scale the unscaled input voltage sample and generate an initial residue voltage having an initial residue magnitude at the voltage output during the initial residue calculation cycle.

In accordance with a further embodiment, the comparator and logic circuit is configured with upper and lower residue voltage trip points, which are different than the upper and lower unscaled voltage trip points and is further configured, after the initial residue calculation cycle, to compare a magnitude of a residue voltage at the voltage input (which can be, for instance, the initial residue voltage or a residue voltage from a different ADC stage) to the upper and lower residue voltage trip points, to generate a next output bit corresponding to the magnitude of the residue voltage at the voltage input, and to generate a gain control signal; and wherein the switched capacitor circuit is further configured to receive the residue voltage at the voltage input and the gain control signal and to generate a next residue voltage during a next residue calculation cycle. In accordance with yet a further embodiment, the switched capacitor circuit further comprises a second voltage input, coupled to some of the switches, for receiving a reference voltage, wherein the plurality of coupled capacitors and switches is configured to scale the reference voltage while scaling the unscaled input voltage sample and while generating the initial residue voltage during the initial residue calculation cycle.

Thus, the described embodiments of the present disclosure integrate input scaling (and in some embodiments reference scaling) and an initial residue calculation into one (i.e., the same) initial residue calculation cycle, thereby, reducing both processing time and extra circuitry. The disclosed embodiments have the capability of handling both single ended and differential rail-to-rail input signals (e.g., voltages). Moreover, the embodiments that integrate only the input scaling and the initial residue calculation into the same operation (i.e., into the initial residue calculation cycle) can be incorporated into both pipelined ADCs and cyclic ADCs. However, some embodiments that integrate the input scaling, the reference scaling, and the initial residue calculation into the same operation are more suitable for incorporating into cyclic ADCs. This is because the pipelined ADCs typically operate at a much higher speed (e.g., 10-100 times) than the cyclic ADCs, and $A_{VDD}$ current in the pipelined ADCs is typically several orders of magnitude higher than in the cyclic ADCs. Therefore, switched capacitor-based reference voltages, which include transient glitches and high frequency switching noise due to repeated charging and discharging operations, could adversely impact the operation of the pipelined ADC in some embodiments.

For the sake of brevity, conventional techniques related to switched capacitor circuits, ADC architectures, voltage comparator circuits, logic circuits, and other functional aspects of the system (and the individual system operating components) may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion, where the figures illustrate example single ended implementations, those skilled in the art can adapt illustrated techniques for use in differential signaling applications using the provided guidelines without departing from the scope of the present disclosure.

FIG. 1 is a circuit diagram illustrating a portion of an analog-to-digital converter (ADC) 100 having: an initial analog-to-digital converter stage 120 (also referred to herein as a converter stage and an ADC stage) performing input voltage scaling and an initial residue voltage calculation in the same operation, in accordance with an embodiment; and a second ADC stage 130. The ADC stage 120 operates on an unscaled analog input voltage that comprises a single ended input voltage during the initial residue calculation cycle. In an embodiment, ADC stages 120 and 130 comprise the first two stages of a pipelined ADC 100. However, in an alternate embodiment, ADC stage 120 can be modified so that the ADC 100 is arranged to function as a cyclic ADC, for example by employing similar circuit modifications as illustrated and described below by reference to FIG. 4. In such a case, the ADC stage 120 functions in accordance with the present teachings during the initial residue calculation cycle and thereafter functions, for instance, like the ADC stage 130 until the unscaled analog voltage is next sampled. Such a reconfigurable ADC stage 120 can be implemented in a cyclic ADC with the ADC stage 120 as the only stage in one embodiment or in a two-stage cyclic ADC that includes the ADC stage 120 and the ADC stage 130 in an alternate embodiment.

Turning now to the details of the ADC 100 as illustrated in FIG. 1, ADC stage 120 includes a first comparator and logic circuit 112 and a first switched capacitor circuit 122 coupled to the comparator and logic circuit 112 at a voltage input (labeled as Vin) of the switched capacitor circuit 122. In accordance with the present teachings, the comparator and logic circuit 112 is configured with upper and lower unscaled voltage trip points ($V_H$ and $V_L$) and is further configured, prior to an initial residue calculation cycle, to compare a magnitude of an unscaled input voltage (Vin) to the upper and lower unscaled voltage trip points ($V_H$ and $V_L$), to generate at least an initial output bit (Dout) corresponding to the magnitude of the unscaled input voltage Vin, and to generate a voltage scaling and gain control signal (h, m, or l). Further in accordance with the present teachings, the switched capacitor circuit 122 is configured to receive the unscaled input voltage Vin and the voltage scaling and gain control signal (h, m, or l) and to generate an initial residue voltage (Vout) having an initial residue magnitude during the initial residue calculation cycle.

Figure 5:
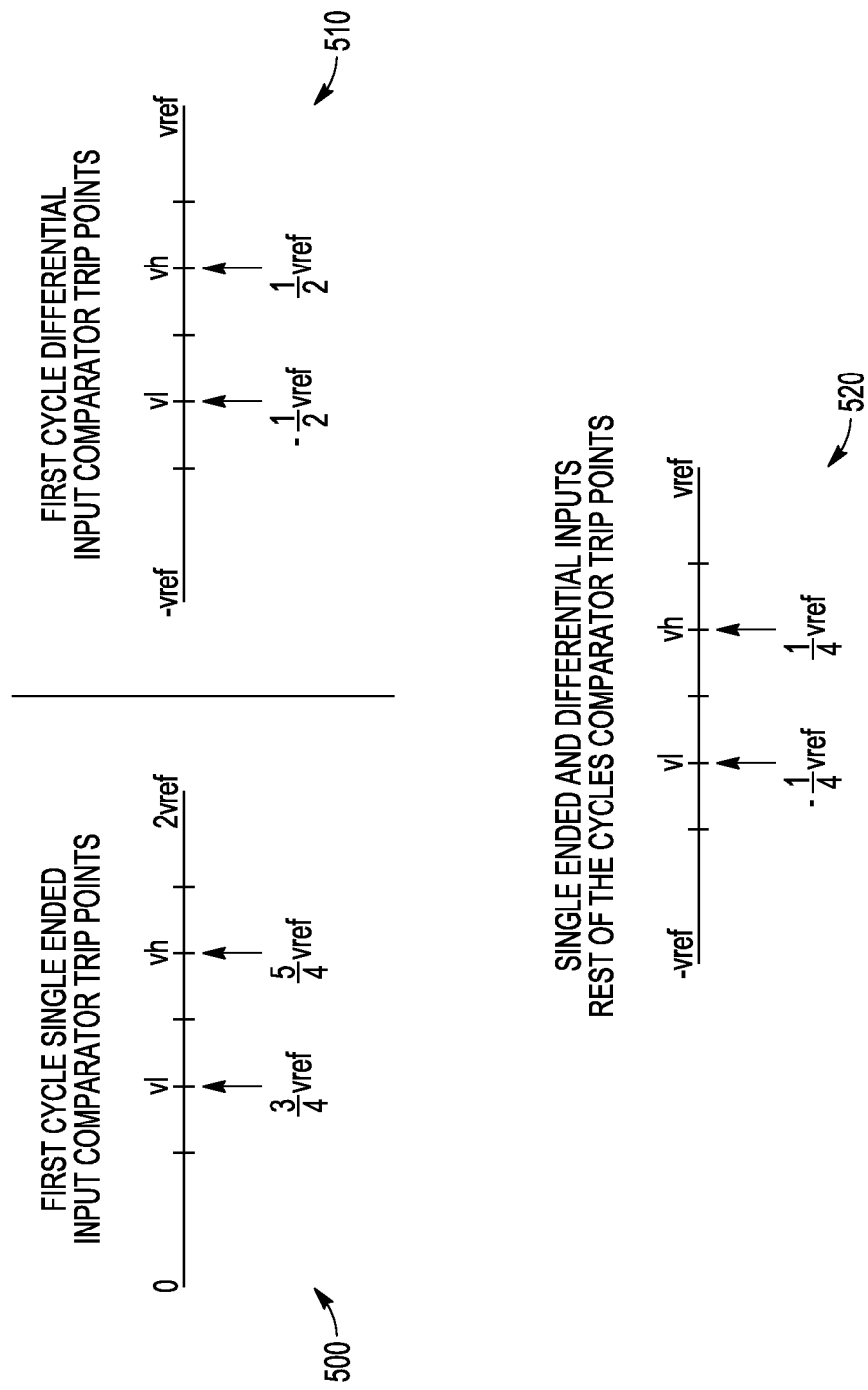
FIG. 5 is a diagram depicting comparator trip points for unscaled single ended and differential input voltages processed using the analog-to-digital converters shown in FIG. 1 to FIG. 4, in accordance with an embodiment.

ADC stage 130 includes a second comparator and logic circuit 134 and a second switched capacitor circuit 132 coupled to the comparator and logic circuit 134 at an output (labeled as Vout) of the switched capacitor circuit 122. The ADC stage 130 is any suitable ADC stage known in the art, for example an ADC stage having a known RSD architecture (e.g., a 1.5 bit RSD stage, explained in more detail later), which performs a residue calculation without scaling the voltage received at the input of the RSD stage. The comparator and logic circuit 134 is configured with upper and lower residue voltage trip points (not shown in FIG. 1 but an example of which is shown in FIG. 5), which are different than the upper and lower unscaled voltage trip points ($V_H$ and $V_L$). Different upper and lower trip points means that at least one of the trip points (the upper trip point or the lower trip point) has changed or is different, although in the disclosed embodiments both the upper and lower trip points are different. The comparator and logic circuit 134 is further configured to compare the magnitude of Vout to the upper and lower residue voltage trip points to generate at least a second output bit (Dout2) corresponding to the magnitude of Vout and to generate a first gain control signal (h2, m2, or l2). The second switched capacitor circuit 132 is configured to receive the initial residue voltage (Vout) and the first gain control signal (h2, m2, or l2) and to generate a second residue voltage ($V_{out2}$) during a second residue calculation cycle, which is provided to a next ADC stage (not shown) of the pipelined ADC 100.

A general description is first provided of an ADC comprising an ADC stage in accordance with the present teachings, including an introduction and description of relevant terminology used throughout this disclosure. In some embodiments, the ADC includes a plurality of ADC stages having an initial stage in accordance with the present teachings, for instance in accordance with any of the embodiments illustrated by reference to FIG. 1-4 or 6-9. In alternate embodiments, the ADC includes only a single ADC stage implemented in accordance with the present teachings. Resolution or accuracy of the ADC is a function of the resolution of each individual stage and the number (N) of bits, of a digital word, generated during a process of converting a sample of an unscaled analog signal (also referred to herein as an unscaled input voltage) to a representative digital signal. The unscaled input voltage comprises a parameter that is being monitored and for which periodic samples are taken and converted to the representative digital signal using the ADC. The frequency at which each sample of the unscaled input voltage is taken and correspondingly converted into a digital word is controlled by a main clock signal for the ADC.

Each ADC stage provides at least one bit of the N-bit ADC resolution, starting with the most significant bit (MSB), e.g., Dout, (also referred to herein as an initial output bit) generated by the comparator and logic circuit of an initial ADC stage, proceeding with a sequence (i.e., two or more) of bits generated by subsequent ADC stages in a pipelined ADC or by the same ADC stage(s) during subsequent residue calculation cycles in a cyclic ADC, and ending with a least significant bit (LSB) from a last or final ADC stage (or residue calculation cycle) implemented in the ADC. Accordingly, the term analog-to-digital conversion process (also referred to herein as an ADC process) refers to one complete cycle of analog-to-digital conversion whereby one sample of an unscaled analog voltage is taken or obtained and converted to a sequence of N bits beginning with the MSB and ending with the LSB.

As used here, the term "initial" means first in a sequence (although the converse is not true, i.e., the use herein of the term "first" does not necessarily imply relative position, unless otherwise stated). Thus, an initial residue calculation cycle is the first residue calculation cycle in a sequence of residue calculation cycles of an analog-to-digital conversion process; and a next or subsequent residue calculation cycle refers to any of the remaining residue calculation cycles of the sequence. An initial residue voltage is the first residue voltage of a sequence of residue voltages generated during the analog-to-digital conversion process; and a next or subsequent residue voltage refers to any of the remaining residue voltages of the sequence. An initial output bit is the first output bit of a sequence of output bits generated during the analog-to-digital conversion process; and a next or subsequent output bit refers to any of the remaining output bits of the sequence.

Turning back to the detailed description of the ADC stage 120 of FIG. 1, as mentioned above, ADC stage 120 is the initial ADC stage of the ADC 100. The initial ADC stage is the ADC stage that performs the initial residue calculation cycle of a sequence of residue calculation cycles for an analog-to-digital conversion process, wherein a residue calculation cycle is the switched capacitor circuit operation that generates or produces a residue voltage at the output of the ADC stage (e.g., labeled as Vout at a node N104). The comparator and logic circuit 112 of the ADC stage 120 comprises: a comparator 114 implemented as an operational amplifier configured with an upper voltage trip point $V_H$ at an inverting input and a non-inverting input coupled to the first voltage input (Vin); a comparator 116 implemented as an operational amplifier configured with a lower voltage trip point $V_L$ at an inverting input and a non-inverting input coupled to the first voltage input (Vin); and a logic circuit 118 coupled to outputs of the comparators 114 and 116.

During operation, in general, when an analog voltage having an associated magnitude appears at the first voltage input of the switched capacitor circuit of the initial ADC stage (e.g., 120), the comparator and logic circuit 112 compares the magnitude of the analog input voltage against at least one of the voltage trip points $V_H$ and $V_L$ and generates a corresponding logic level (e.g., −1, 1, or 0). The logic level determines a digital output bit (e.g., Dout) for the ADC stage 120 and correspondingly sets a control signal (h, m, or l) used to selectively close one or more gain control switch(s) of the switched capacitor circuit 122, in order to produce a corresponding analog remainder voltage (referred to herein as a residue voltage) at the output labeled Vout. As used herein, a residue voltage is the remainder of the analog input voltage less the value of the logic bit produced by the comparator and logic circuit. More particularly, when the magnitude of the analog input voltage is larger than $V_H$, the logic circuit 118 sets the control signal to h, and the gain control switch(s) controlled by the control signal h are closed during the following residue calculation cycle. When the magnitude of the analog input voltage is between $V_L$ and $V_H$, the logic circuit 118 sets the control signal to m, and the gain control switch(s) controlled by the control signal m are closed during the following residue calculation cycle. When the magnitude of the analog input voltage is less than $V_L$, the logic circuit 118 sets the control signal to l, and the gain control switch(s) controlled by the control signal l are closed during the following residue calculation cycle.

In accordance with the teachings herein, the comparator and logic circuit 112 is configured with upper and lower voltage trip points that are different than the upper and lower trip points used by the comparator and logic circuit 134. More particularly, prior to the initial residue calculation cycle (which is performed by the switched capacitor circuit 122), the upper and lower voltage trip points of the comparator and logic circuit 112 comprise upper and lower unscaled voltage trip points ($V_H$ and $V_L$), which are compared to the magnitude of an unscaled input voltage. The unscaled input voltage is an analog input voltage having a magnitude (or value) that can swing from rail-to-rail. Such a voltage must be scaled to the operating range of an operational amplifier 102 within the switched capacitor circuit 122. However, after the initial residue calculation cycle, the upper and lower voltage trip points used by the comparator and logic circuit 134 (and used until the next unscaled input voltage sample is taken) comprises upper and lower residue voltage trip points, which are different than the upper and lower unscaled voltage trip points. The upper and lower residue voltage trip points are compared to the magnitude of the residue voltage Vout generated by the preceding ADC stage 122, which appears at the input of the ADC stage 130. The residue voltage Vout has a residue magnitude that falls within the operating range of an operational amplifier within the switched capacitor circuit 132 (not shown), and thus generally requires no scaling.

Accordingly, at the beginning of an ADC process during a first period of the main clock signal for the ADC 100, the comparator and logic circuit 112 is configured, prior to the initial residue calculation cycle, to compare a magnitude of an unscaled input voltage (at Vin) to the first upper $V_H$ and lower $V_L$ unscaled voltage trip points using the comparators 114 and 116. The results of the comparison are fed to the logic circuit 118, which uses the results to generate an initial output bit (Dout) corresponding to the magnitude of the unscaled input voltage, and to generate a voltage scaling and gain control signal (h, m, l) for use in the initial residue calculation cycle. It should be noted that only the control signal generated prior to the initial residue calculation cycle is referred to herein as the "voltage scaling and gain control signal", and all other control signals generated after the initial residue calculation cycle are referred to herein simply as "gain control signals."

Turning momentarily to FIG. 5, shown therein are diagrams 500, 510, and 520 depicting example values for upper and lower voltage trip point sets. In one embodiment, the comparator and logic circuit 112 is configured with first upper and lower unscaled voltage trip points having values ($V_H$=5/4vref and $V_L$=3/4vref from a range of 0 to 2vref) shown in diagram 500, to process a single ended input voltage prior to the initial residue calculation cycle. Vref is a reference voltage provided to the switched capacitor circuit of the ADC stages. By contrast, the comparator and logic circuit 134 is configured with upper and lower residue voltage trip points having values ($V_H$=1/4vref and $V_L$=−1/4vref from a range of −vref to vref) shown in diagram 520, to process the initial residue voltage Vout.

Turning again to the description of the ADC 100 of FIG. 1, the switched capacitor circuit 122 further includes: a second voltage input (labeled as vref) for receiving a reference voltage; a voltage supply node N100 (which is coupled to a common mode voltage $V_{CM}$ (also referred to in the art as a voltage common mode or AC ground), which in some implementations is a voltage that is approximately in the middle of the operating range of the operational amplifier 102; a voltage output (which is the output Vout of the ADC stage 120 at the node N104); a plurality of coupled switches and capacitors, with the connectivity of these elements described below; and the operational amplifier 102 having an inverting input coupled to ("at") the node N100, a non-inverting input at a node N102, and an output terminal coupled to (and serving as) the voltage output (Vout) of the switched capacitor circuit 120, at the node N104. The plurality of coupled capacitors comprises four capacitors 104, 106, 108, and 110 each having a same capacitance value and each having first and second terminals. As shown, all four capacitors have a first terminal coupled together at a node N106. The second terminal of the capacitor 104 is coupled to a node N108. The second terminal of the capacitor 106 is coupled to a node N110. The second terminal of the capacitor 108 is coupled to a node N112. The second terminal of the capacitor 110 is coupled to a node N114.

The plurality of coupled switches comprises a first set of switches (S100, S102, S104, S106, and S108) coupled to the first voltage input (Vin), the voltage supply node N100 and the four capacitors 104-110. The remainder of the plurality of coupled switches comprises a second set of switches (S110, S112, S114, S116, S118, S120, and S122) that includes a subset of the switches (S116, S118, S120, and S122) that are selectively controlled by the voltage scaling and gain control signal (h, m, l) provided by the comparator and logic circuit 112. Selectively controlling (also referred to herein as selectively closing) the subset of switches means that only selected ones of the subset of switches are closed during the residue calculation cycle depending on which control signal h, m, or l is output from the logic circuit. The second set of switches (S110-S122) is coupled to the second voltage input (vref), the voltage supply node N100, the four capacitors 104-110, and the non-inverting input at node N102 and the output (at Vout) of the operational amplifier 102. Each switch has at least first and second terminals and can be implemented using any suitable transistor technology including, but not limited to, MOSFET (metal oxide semiconductor field effect transistor) technology.

The connectivity of the switches within this illustrative switched capacitor circuit 122 is as follows. The first terminal of switch S100 is coupled to the first voltage input (Vin), and the second terminal is coupled to the node N108. The first terminal of switch S102 is coupled to the first voltage input (Vin), and the second terminal is coupled to the node N110. The first terminal of switch S104 is coupled to the voltage supply node, and the second terminal is coupled to the node N112. The first terminal of switch S106 is coupled to the voltage supply node, and the second terminal is coupled to the node N114. The first terminal of switch S108 is coupled to the voltage supply node, and the second terminal is coupled to the node N106. The first terminal of switch S110 is coupled to the node N108, and the second terminal is coupled to the output of the operational amplifier 102 at the node N104. The first terminal of switch S112 is coupled to the node N106, and the second terminal is coupled to the non-inverting input of the operational amplifier 102 at the node N102. The first terminal of switch S114 is coupled to the second voltage input (vref), and the second terminal is coupled to the node N110. The first terminal of switch S116 is coupled to the voltage supply node, and the second terminal is coupled to the node N112. The first terminal of switch S118 is coupled to the second voltage input (vref), and the second terminal is coupled to the node N112. The first terminal of switch S120 is coupled to the voltage supply node, and the second terminal is coupled to the node N114. The first terminal of switch S122 is coupled to the second voltage input (vref), and the second terminal is coupled to the node N114.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S100-S108 (also referred to herein as sampling control switches) is governed by a sampling control clock signal p1. The second set of switches S110-S122 (also referred to herein as gain control switches) is governed by a gain control clock signal p2. The subset (S116-S122) of the switches is governed by control signals h, m, and l with: switch S116 being controlled to close by control signal l; switch S118 being controlled to close by control signals h or m; switch S120 being controlled to close by control signal l; and switch S122 being controlled to close by control signal h.

As used herein, sampling control switches are switches that are or can be closed using a requisite sampling control clock signal to configure or reconfigure the switched capacitor circuit during a sample (or sampling) cycle of the circuit. Gain control switches are switches that are or can be closed using a requisite gain control clock signal to configure or reconfigure the switched capacitor circuit during a gain cycle of the circuit (also referred to herein as a residue calculation cycle). A sampling control clock signal refers to a family of periodic clock signals (that typically also includes a delayed and complementary clock signal) derived from or associated with the main clock signal of the ADC and used to clock the sampling control switches during the sample cycle of a switched capacitor circuit. A gain control clock signal refers to a family of periodic clock signals (that typically also includes a delayed and complementary clock signal) derived from or associated with the main clock signal of the ADC and used to clock the gain control switches during the residue calculation cycle of a switched capacitor circuit. The sampling control clock signal and the gain control clock signal are non-overlapping with respect to each other. Two clock signals are non-overlapping with respect to each other if only one of the clock signals is high at any given time. In other words, if two non-overlapping clock signals are viewed on the same time axis, the repetitive clock pulses of the respective signals never overlap and are always separated, in time, from one another. Accordingly, the sample cycle and the residue calculation cycle of each ADC stage of the ADC always occur at non-overlapping points in time.

During operation of the initial ADC stage 100, during the same main clock period in which the comparator and digital circuit 112 generates the initial output bit, the first set of switches (S100-S108) is configured to close under the control of the sampling control clock signal p1 during the sample cycle to charge the capacitors 104 and 106 in order to sample an unscaled input voltage at the first voltage input (Vin), thereby generating an unscaled input voltage sample. Upon the conclusion of the sample cycle when control signal p1 controls the first set of switches to open, the second set of switches (S110-S122) is configured to selectively close under the control of the gain control clock signal p2 and the voltage scaling and gain control signal (h, m, or l), generated by the comparator and logic circuit 112 during the initial main clock period that initiated the ADC process, to scale the unscaled input voltage sample and generate the initial residue voltage based on the comparison of the magnitude of the unscaled input voltage to the first upper and lower unscaled voltage trip points (e.g., as shown in diagram 500 of FIG. 5).

In the illustrative circuit arrangement 120, during the initial residue calculation phase and when the unscaled input voltage comprises a single ended input voltage, the switched capacitor circuit generates the initial residue voltage at the node N104 having a magnitude determined by and in accordance with the following set of equations:

$$\text{when, } Vin > Vh \quad (1)$$
$$Vout = 2(Vin - vref) - vref;$$
$$Vout = 2Vin - 3vref$$

$$\text{when, } Vh > Vin > V1 \quad (2)$$
$$Vout = 2(Vin - vref)$$
$$Vout = 2Vin - 3vref;$$

$$\text{when, } Vin < V1 \quad (3)$$
$$Vout = 2(Vin - vref) + vref$$
$$Vout = 2Vin - 3vref,$$

wherein Vin is the magnitude of the unscaled input voltage, Vout is the initial residue magnitude, vref is a magnitude of the reference voltage, Vh (i.e., $V_H$) is the upper unscaled voltage trip point, and Vl (i.e., $V_L$) is the lower unscaled voltage trip point. In the sets of equations (1), (2), and (3), the magnitude (Vin) of the unscaled input voltage is scaled by (−2vref) to maintain the input voltage within operating range of the operational amplifier 102.

The residue voltage Vout is provided to the next ADC stage 130. In some embodiments, the ADC stage 130 is a known 1.5 bit RSD ADC stage, which provides a one bit logic output and 0.5 bit of redundancy, used for digital correction to reduce comparator offset requirements. Accordingly, the comparator and logic circuit 134 also comprises two comparators and a logic circuit that function in a similar manner as the comparator and logic circuit 112, except that the upper and lower voltage trip points are the upper and lower residue voltage trip point which, for example, have the values shown in diagram 520 of FIG. 5. The switched capacitor circuit 132 comprises an operational amplifier, and a plurality of capacitors and switches coupled and configured to generate $V_{out2}$ by multiplying Vout by a factor of two and then adding a voltage of vref, 0, or −vref depending on which control signal (h2, m2, or l2) the comparator and logic circuit 134 generates. More particularly, Vin>Vh, Vout=2Vin−vref; when Vh>Vin>Vl, Vout=2Vin; and when Vin<Vl, Vout=2Vin+vref.

Figure 2:
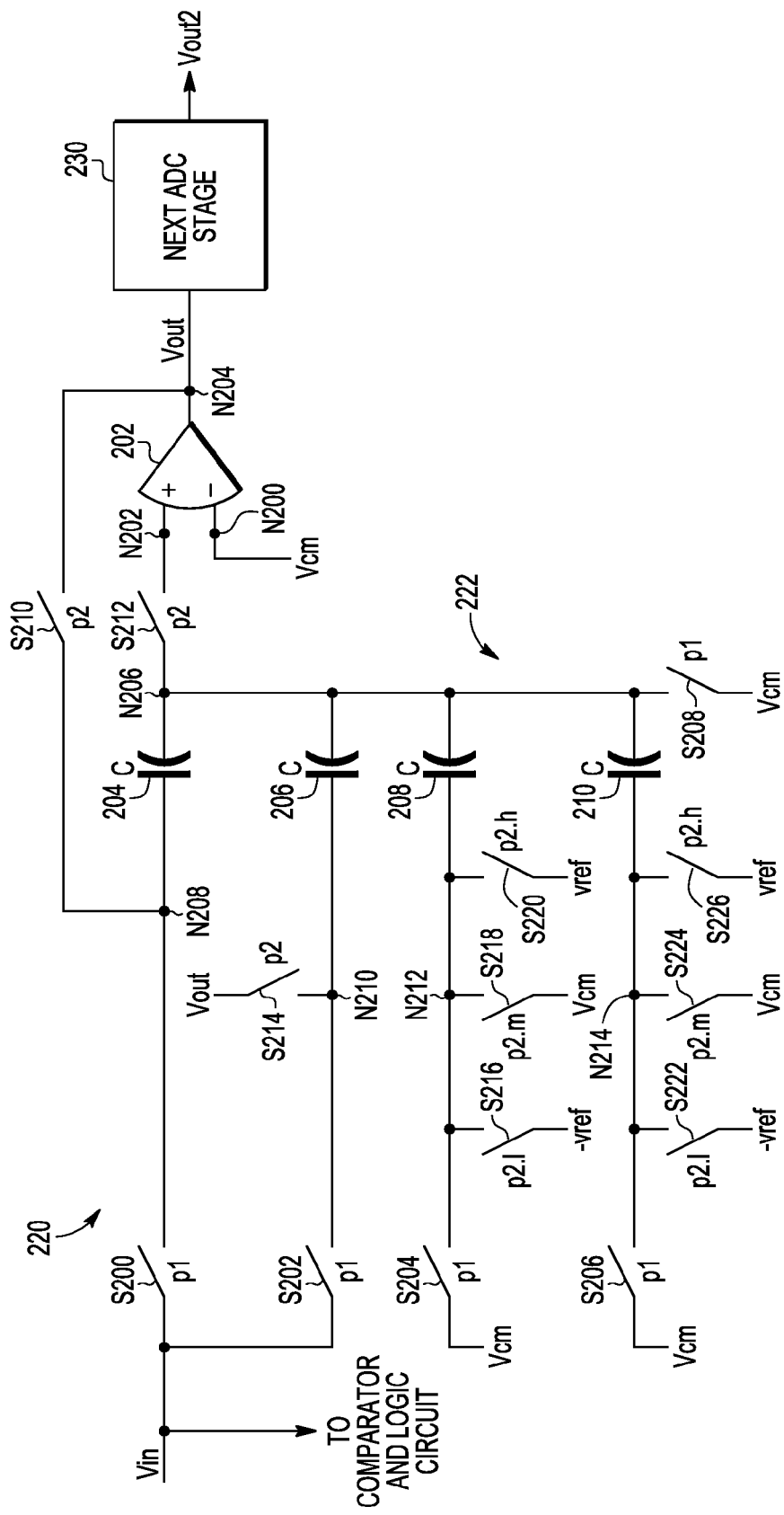
FIG. 2 is a circuit diagram illustrating a portion of an analog-to-digital converter having an ADC stage performing input voltage scaling and an initial residue voltage calculation in the same operation, in accordance with another embodiment.

Turning now to FIG. 2, shown therein is a circuit diagram illustrating a portion of an ADC 200 having: an initial ADC stage 220 performing input voltage scaling and an initial residue voltage calculation in the same operation, in accordance with another embodiment; and a second ADC stage 230. The ADC stage 220 operates on an unscaled analog input voltage that comprises a differential input voltage. In an embodiment, ADC stages 220 and 230 comprise the first two stages of a pipelined ADC 200. However, in an alternate embodiment, ADC stage 220 can be modified so that the ADC 200 is arranged to function as a cyclic ADC, for example by employing similar circuit modifications as illustrated and described below by reference to FIG. 4. In such a case, the ADC stage 220 functions in accordance with the present teachings during the initial residue calculation cycle and thereafter functions, for instance, like the ADC stage 230 until the unscaled analog voltage is next sampled. Such a reconfigurable ADC stage 220 can be implemented in a cyclic ADC with the ADC stage 220 as the only stage in one embodiment or in a two-stage cyclic ADC that includes the ADC stage 220 and the ADC stage 230 in an alternate embodiment.

ADC stage 220 includes a comparator and logic circuit (not shown in FIG. 2) and a switched capacitor circuit 222 coupled to the comparator and logic circuit at a first voltage input (labeled as Vin) of the switched capacitor circuit. The comparator and logic circuit of the ADC stage 220 comprises two comparators and a logic circuit that function in a similar manner as the comparator and logic circuit 112, except that the upper and lower voltage trip points are second upper and lower unscaled voltage trip point that are different than the first upper and lower unscaled voltage trip points used by the comparator and logic circuit 112. The second upper and lower unscaled voltage trip points are used when the unscaled input voltage comprises a differential voltage and, in one embodiment, have the values ($V_H$=−½ vref and $V_L$=½ vref from a range of −vref to vref) as shown in diagram 510 of FIG. 5.

The switched capacitor circuit 222 further: a second voltage input (labeled as vref) for receiving a reference voltage; a third voltage input (labeled as −vref) for receiving a negative reference voltage; a voltage supply node N200 which is coupled to a common mode voltage $V_{CM}$, which in some implementations is a voltage that is approximately in the middle of the operating range of the ADC stage 220; a voltage output (which is an output Vout of the ADC stage 220) at a node N204; a plurality of coupled switches and capacitors, with the connectivity of these elements described below; and an operational amplifier 202 having an inverting input coupled to ("at") the node N200, a non-inverting input at a node N202, and an output terminal coupled to (and serving as) the voltage output (Vout) of the switched capacitor circuit, at the node N204. The plurality of coupled capacitors comprises four capacitors 204, 206, 208, and 210 each having a same capacitance value and each having first and second terminals. As shown, all four capacitors have a first terminal coupled together at a node N206. The second terminal of the capacitor 204 is coupled to a node N208. The second terminal of the capacitor 206 is coupled to a node N210. The second terminal of the capacitor 208 is coupled to a node N212. The second terminal of the capacitor 210 is coupled to a node N214.

The plurality of coupled switches comprises a first set of switches (S200, S202, S204, S206, and S208) coupled to the first voltage input (Vin), the voltage supply node N200 and the four capacitors 204-210. The remainder of the plurality of coupled switches comprises a second set of switches (S210, S212, S214, S216, S218, S220, S222, S224, and S226) that includes a subset of the switches (S216, S218, S220, S222, S224, and S226) that are selectively controlled by the voltage scaling and gain control signal (h, m, l) provided by the comparator and logic circuit. The second set of switches (S210-S226) is coupled to the second voltage input (vref), the third voltage input (-vref), the voltage supply node N200, the four capacitors 204-210, and the non-inverting input at node N202 and the output (at Vout) of the operational amplifier 202. Each switch has at least first and second terminals and can be implemented using any suitable transistor technology including, but not limited to, MOSFET technology.

The connectivity of the switches within this illustrative switched capacitor circuit is as follows. The first terminal of switch S200 is coupled to the first voltage input (Vin), and the second terminal is coupled to the node N208. The first terminal of switch S202 is coupled to the first voltage input (Vin), and the second terminal is coupled to the node N210. The first terminal of switch S204 is coupled to the voltage supply node, and the second terminal is coupled to the node N212. The first terminal of switch S206 is coupled to the voltage supply node, and the second terminal is coupled to the node N214. The first terminal of switch S208 is coupled to the voltage supply node, and the second terminal is coupled to the node N206. The first terminal of switch S210 is coupled to the node N208, and the second terminal is coupled to the output of the operational amplifier 202 at the node N204. The first terminal of switch S212 is coupled to the node N206, and the second terminal is coupled to the non-inverting input of the operational amplifier 202 at the node N202. The first terminal of switch S214 is coupled to the output (Vout), and the second terminal is coupled to the node N210. The first terminal of switch S216 is coupled to the third voltage input (-vref), and the second terminal is coupled to the node N212. The first terminal of switch S218 is coupled to the voltage supply node, and the second terminal is coupled to the node N212. The first terminal of switch S220 is coupled to the second voltage input (vref), and the second terminal is coupled to the node N212. The first terminal of switch S222 is coupled to the third voltage input (-vref), and the second terminal is coupled to the node N214. The first terminal of switch S224 is coupled to the voltage supply node, and the second terminal is coupled to the node N214. The first terminal of switch S226 is coupled to the second voltage input (vref), and the second terminal is coupled to the node N214.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S200-S208 (also referred to herein as sampling control switches) is governed by a sampling control clock signal p1. The second set of switches S210-S226 (also referred to herein as gain control switches) is governed by a gain control clock signal p2. The subset (S216-S226) of the switches is governed by control signals h, m, and l with: switch S216 being controlled to close by control signal l; switch S218 being controlled to close by control signal m; switch S220 being controlled to close by control signal h; and switch S222 being controlled to close by control signal l; switch S224 being controlled to close by control signal m; and switch S226 being controlled to close by control signal h.

During operation of the initial ADC stage 220, during the same main clock period in which the comparator and digital circuit generates the initial output bit, the first set of switches (S200-S208) is configured to close under the control of the sampling control clock signal p1 during the sample cycle to charge the capacitors 204 and 206 in order to sample an unscaled input voltage at the first voltage input (Vin), thereby generating an unscaled input voltage sample. Upon the conclusion of the sample cycle when control signal p1 controls the first set of switches to open, the second set of switches (S210-S226) is configured to selectively close under the control of the gain control clock signal p2 and the voltage scaling and gain control signal (h, m, or l), generated by the comparator and logic circuit during the initial main clock period that initiated the ADC process, to scale the unscaled input voltage sample and generate the initial residue voltage based on the comparison of the magnitude of the unscaled input voltage to the first upper and lower unscaled voltage trip points (e.g., as shown in diagram 510 of FIG. 5).

In the illustrative circuit arrangement 220, during the initial residue calculation cycle and when the unscaled input voltage comprises a differential input voltage, the switched capacitor circuit generates the initial residue voltage at the node N204 having a magnitude determined by and in accordance with the following sets of equations:

$$\text{when, } Vin > Vh \qquad (4)$$
$$Vout = 2\left(\frac{Vin}{2}\right) - vref;$$
$$2Vout = 2Vin - 2vref$$

$$\text{when, } Vh > Vin > Vl \qquad (5)$$
$$Vout = 2\left(\frac{Vin}{2}\right);$$
$$2Vout = 2Vin$$

$$\text{when, } Vin < Vl \qquad (6)$$
$$Vout = 2\left(\frac{Vin}{2}\right) + vref,$$
$$2Vout = 2Vin + 2vref$$

wherein Vin is the magnitude of the unscaled input voltage, Vout is the initial residue magnitude, vref is a magnitude of the reference voltage, Vh is the upper unscaled voltage trip point, and Vl is the lower unscaled voltage trip point. In the sets of equations (4), (5), and (6), the magnitude (Vin) of the unscaled input voltage is scaled by (½) to maintain the input voltage within operating range of the operational amplifier 202. The residue voltage Vout is provided to the next ADC stage 230, which in some embodiments is a 1.5 bit RSD ADC stage. In this illustrative pipelined ADC implementation, the ADC stage 230 provides a residue voltage $V_{out2}$ to the next ADC stage (not shown).

Figure 3:
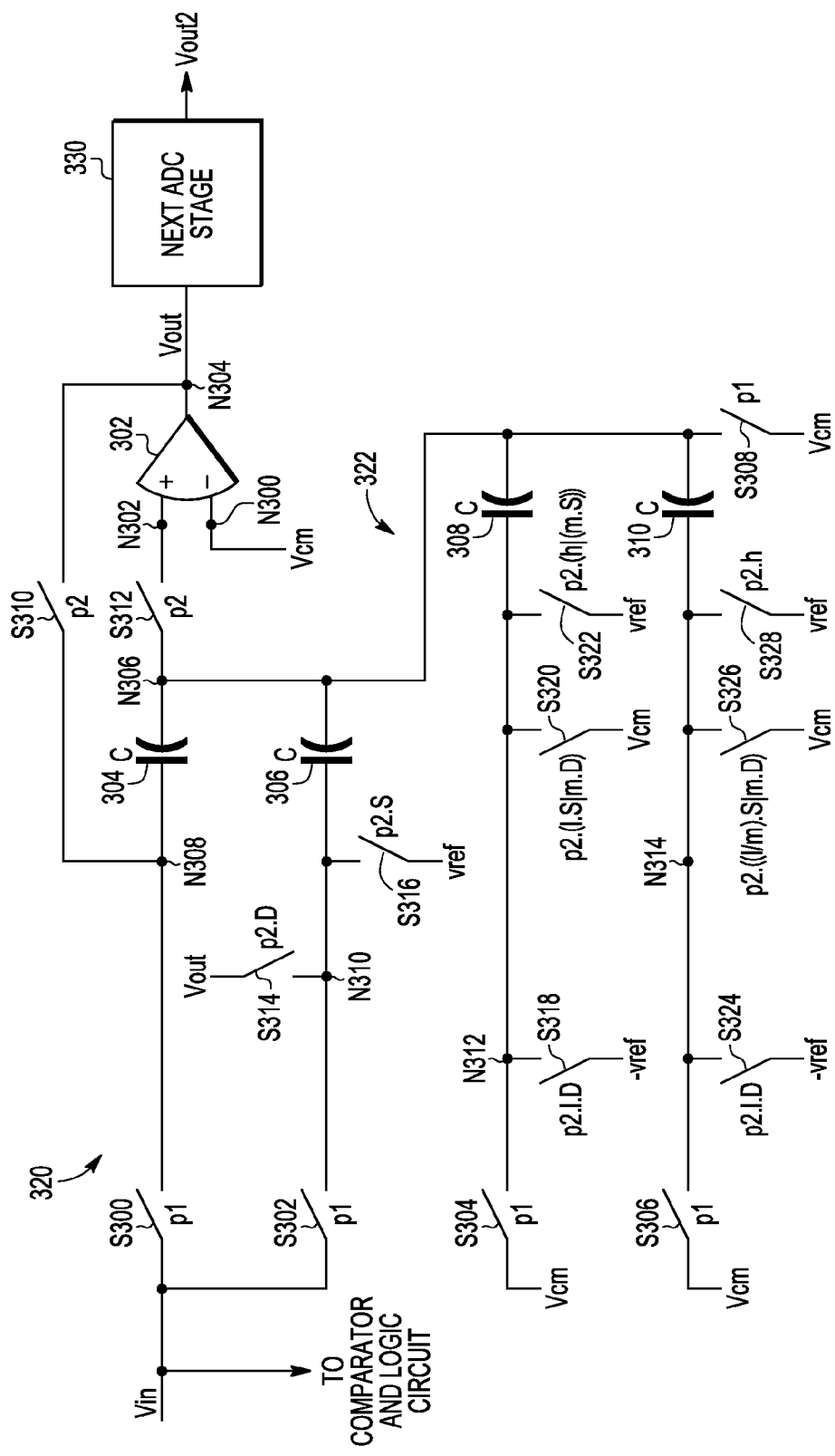
FIG. 3 is a circuit diagram illustrating a portion of an analog-to-digital converter having an ADC stage performing input voltage scaling and an initial residue voltage calculation in the same operation, in accordance with another embodiment.

Turning now to FIG. 3, shown therein is a circuit diagram illustrating a portion of an ADC 300 having: an initial ADC stage 320 performing input voltage scaling and an initial residue voltage calculation in the same operation, in accordance with another embodiment; and a second ADC stage 330. The ADC stage 320 operates on an unscaled analog input voltage that comprises either a single ended input voltage or a differential input voltage. In an embodiment, ADC stages 320 and 330 comprise the first two stages of a pipelined ADC 300. However, in an alternate embodiment, ADC stage 320 can be modified so that the ADC 300 is arranged to function as a cyclic ADC, for example by employing similar circuit modifications as illustrated and described below by reference to FIG. 4. In such a case, the ADC stage 320 functions in accordance with the present teachings during the initial residue calculation cycle and thereafter functions, for instance, like the ADC stage 330 until the unscaled analog voltage is next sampled. Such a reconfigurable ADC stage 320 can be implemented in a cyclic ADC with the ADC stage 320 as the only stage in one embodiment or in a two-stage cyclic ADC that includes the ADC stage 320 and the ADC stage 330 in an alternate embodiment.

ADC stage 320 includes a comparator and logic circuit (not shown in FIG. 3) and a switched capacitor circuit 322 coupled to the comparator and logic circuit at a first voltage input (labeled as Vin) of the switched capacitor circuit. In an embodiment, the comparator and logic circuit of the ADC stage 320 is configured as a comparator and logic circuit 1200 shown in FIG. 12. The comparator and logic circuit 1200 includes a comparator 1206, a comparator 1208, and a logic circuit 1204. The comparator 1206 is implemented as an operational amplifier having: a non-inverting input coupled to receive an analog input voltage (e.g., the unscaled input voltage Vin in a pipelined ADC arrangement and a residue voltage Vout in a cyclic ADC arrangement); an inverting input coupled to multiple upper unscaled voltage trip points, $V_{HS}$ and $V_{HD}$; and an output coupled to the logic circuit 1204. The comparator 1208 is implemented as an operational amplifier having: a non-inverting input coupled to receive the analog input voltage; an inverting input coupled to multiple lower unscaled voltage trip points, $V_{LS}$ and $V_{LD}$; and an output coupled to the logic circuit 1204.

As implemented in the ADC stage 320 (of FIG. 3), when the ADC 300 is a pipelined ADC, the inverting input of the comparator 1206 is coupled to $V_{HS}$ using a switch S1200 and to $V_{HD}$ using a switch 1202; and the inverting input of the comparator 1208 is coupled to $V_{LS}$ using a switch S1206 and to $V_{LD}$ using a switch 1208. Accordingly, prior to the initial residue calculation cycle, the comparator and logic circuit 1200 is configured with first upper ($V_{HS}$) and lower ($V_{LS}$) unscaled voltage trip points when the unscaled input voltage Vin is a single-ended voltage and is configured with second upper ($V_{HD}$) and lower ($V_{LD}$) unscaled voltage trip points when the unscaled input voltage Vin is a differential voltage. In an embodiment, the first upper ($V_{HS}$) and lower ($V_{LS}$) unscaled voltage trip points have the values illustrated in diagram 500 of FIG. 5, and the second upper ($V_{HD}$) and lower ($V_{LD}$) unscaled voltage trip points have the values illustrated in diagram 510 of FIG. 5. As implemented in the ADC stage 320 (of FIG. 3), when the ADC 300 is a cyclic ADC, the inverting input of the comparator 1206 is further coupled to an upper residue voltage trip point $V_{HR}$ using a switch S1204, and the inverting input of the comparator 1208 is further coupled to a lower residue voltage trip point $V_{LR}$ using a switch S1210. In an embodiment, the upper ($V_{HR}$) and lower ($V_{LR}$) unscaled voltage trip points have the values illustrated in diagram 520 of FIG. 5.

The closing of the switches S1200, S1202, S1204, S1206, S1208, and S1210 is controlled by control signals $C_S$, $C_D$ and $C_R$ provided by a finite state machine 1202 of the ADC. More particularly, a controller (not shown) of the ADC controls the finite state machine 1202 to: generate the control signal $C_S$ when the analog input voltage is a single-ended input voltage signal; generate the control signal $C_D$ when the analog input signal is a differential input voltage signal; and generate the control signal $C_R$ when the analog input voltage is a residue voltage. Once the appropriate upper and lower unscaled voltage trip points are connected to the comparators 1206 and 1208, the comparator and logic circuit 1200 functions in the same manner as the comparator and logic circuit 112 (of FIG. 1) to compare the magnitude of the input voltage to the upper and lower voltage trip points to generate an output bit Dout and a voltage scaling and gain control signal (or a gain control signal) h, m, or l depending on the results of the comparison.

Returning to the description of FIG. 3, the switched capacitor circuit 322 further includes: a second voltage input (labeled as vref) for receiving a reference voltage; a third voltage input (labeled as −vref) for receiving a negative reference voltage; a voltage supply node N300 which is coupled to a common mode voltage $V_{CM}$, which in some implementations is a voltage that is approximately in the middle of the operating range of the ADC stage 320; a voltage output (which is an output Vout of the ADC stage 320) at a node N304; a plurality of coupled switches and capacitors, with the connectivity of these elements described below; and an operational amplifier 302 having an inverting input coupled to ("at") the node N300, a non-inverting input at a node N302, and an output terminal coupled to (and serving as) the voltage output (Vout) of the switched capacitor circuit, at the node N304. The plurality of coupled capacitors comprises four capacitors 304, 306, 308, and 310 each having a same capacitance value and each having first and second terminals. As shown, all four capacitors have a first terminal coupled together at a node N306. The second terminal of the capacitor 304 is coupled to a node N308. The second terminal of the capacitor 306 is coupled to a node N310. The second terminal of the capacitor 308 is coupled to a node N312. The second terminal of the capacitor 310 is coupled to a node N314.

The plurality of coupled switches comprises a first set of switches (S300, S302, S304, S306, and S308) coupled to the first voltage input (Vin), the voltage supply node N300 and the four capacitors 304-310. The remainder of the plurality of coupled switches comprises a second set of switches (S310, S312, S314, S316, S318, S320, S322, S324, S326, and S328) that includes a subset of the switches (S318, S320, S322, S324, S326, and S328) that are selectively controlled by the voltage scaling and gain control signal (h, m, l) provided by the comparator and logic circuit 1200 and at least the control signals $C_S$ and $C_D$ provided by the finite state machine 1202. The second set of switches (S310-S328) is coupled to the second voltage input (vref), the third voltage input (−vref), the voltage supply node N300, the four capacitors 304-310, and the non-inverting input at node N302 and the output (at Vout) of the operational amplifier 302. Each switch has at least first and second terminals and can be implemented using any suitable transistor technology including, but not limited to, MOSFET technology.

The connectivity of the switches within this illustrative switched capacitor circuit is as follows. The first terminal of switch S300 is coupled to the first voltage input (Vin), and the second terminal is coupled to the node N308. The first terminal of switch S302 is coupled to the first voltage input (Vin), and the second terminal is coupled to the node N310. The first terminal of switch S304 is coupled to the voltage supply node, and the second terminal is coupled to the node N312. The first terminal of switch S306 is coupled to the voltage supply node, and the second terminal is coupled to the node N314. The first terminal of switch S308 is coupled to the voltage supply node, and the second terminal is coupled to the node N306. The first terminal of switch S310 is coupled to the node N308, and the second terminal is coupled to the output of the operational amplifier 302 at the node N304. The first terminal of switch S312 is coupled to the node N306, and the second terminal is coupled to the non-inverting input of the operational amplifier 302 at the node N302. The first terminal of switch S314 is coupled to the output (Vout), and the second terminal is coupled to the node N310. The first terminal of switch S316 is coupled to the second voltage input (vref), and the second terminal is coupled to the node N310. The first terminal of switch S318 is coupled to the third voltage input (−vref), and the second terminal is coupled to the node N312. The first terminal of switch S320 is coupled to the voltage supply node, and the second terminal is coupled to the node N312. The first terminal of switch S322 is coupled to the second voltage input (vref), and the second terminal is coupled to the node N312. The first terminal of switch S324 is coupled to the third voltage input (−vref), and the second terminal is coupled to the node N314. The first terminal of switch S326 is coupled to the voltage supply node, and the second terminal is coupled to the node N314. The first terminal of switch S328 is coupled to the second voltage input (vref), and the second terminal is coupled to the node N314.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S300-S308 (also referred to herein as sampling control switches) is governed by a sampling control clock signal p1. The second set of switches S310-S328 (also referred to herein as gain control switches) is governed by a gain control clock signal p2. In addition, the gain control switches may be labeled with an "S" or "D". More particularly, a gain control switch labeled with only an "S" is controlled to close only when the control signal $C_S$ (FIG. 12) is high and is used only when operating on a single ended input voltage. A gain control switch labeled with only a "D" is controlled to close only when the control signal $C_D$ (FIG. 12) is high and is used only when operating on a differential input voltage. A gain control switch labeled with both an "S" and a "D" is used when operating on either a single ended or differential input voltage, depending on the particular control signal (h, m, or l) applied to the switch. A gain control switch having no "S" or "D" label is used when operating on either a single ended or differential input voltage.

Moreover, the subset (S318-S328) of the switches is governed by control signals h, m, and l as follows. Switch S318 is controlled to close by control signal l when operating on a differential signal. Switch S320 is controlled to close by control signal m when operating on a differential signal and by control signal l when operating on a single ended signal. Switch S322 is controlled to close by control signal h when operating on either a single ended or differential signal and by control signal m when operating on a single ended signal. Switch S324 is controlled to close by control signal l when operating on a differential signal. Switch S326 is controlled to close by control signal m when operating on a differential signal and by control signal l when operating on a single ended signal. Switch S328 is controlled to close by control signal h when operating on either a single ended or differential signal.

During operation of the initial ADC stage 320, during the same main clock period in which the comparator and digital circuit 1200 generates the initial output bit, the first set of switches (S300-S308) is configured to close under the control of the sampling control clock signal p1 during the sample cycle to charge the capacitors 304 and 306 in order to sample an unscaled input voltage at the first voltage input (Vin), thereby generating an unscaled input voltage sample. Upon the conclusion of the sample cycle when control signal p1 controls the first set of switches to open, the second set of switches (S310-S328) is configured to selectively close under the control of the gain control clock signal p2, the voltage scaling and gain control signal (h, m, or l) generated by the comparator and logic circuit 1200 during the initial main clock period that initiated the ADC process and the control signal ($C_S$ or $C_D$) provided by the finite state machine 1202, to scale the unscaled input voltage sample and generate the initial residue voltage based on the comparison of the magnitude of the unscaled input voltage to the first upper and lower unscaled voltage trip points (e.g., as shown in diagram 500 or 510 of FIG. 5, depending on whether the unscaled input voltage comprises a single ended or differential input voltage).

In the illustrative circuit arrangement 320, during the initial residue calculation phase and when the unscaled input voltage comprises a single ended input voltage, the switched capacitor circuit generates the initial residue voltage at the node N304 having a magnitude determined by and in accordance with the sets of equations (1), (2), and (3) above. When the unscaled input voltage comprises a differential input voltage, the switched capacitor circuit generates the initial residue voltage at the node N304 having a magnitude determined by and in accordance with the sets of equations (4), (5), and (6) above. The residue voltage is provided to the next ADC stage 330, which in some embodiments is a 1.5 bit RSD ADC stage. In this illustrative pipelined ADC implementation, the ADC stage 330 provides a residue voltage $V_{out2}$ to the next ADC stage (not shown).

As stated earlier, in an alternative embodiment, the ADCs shown in FIG. 1 to FIG. 3 can be configured to have a cyclic ADC configuration. In such embodiments, a single ADC stage (e.g., ADC stages 120, 220, or 320) is used as the initial stage of the ADC for the initial residue calculation cycle and then reconfigured to have a circuit arrangement that does not scale the input voltage, such as 1.5 bit RSD ADC circuit arrangement, for subsequent residue calculation cycles. Thus, in further accordance with the present teachings, after the initial residue calculation cycle, the second set of (gain control) switches is configured to selectively close under the control of the gain control clock signal and one or more control signals (h, m, l, $C_R$) to generate a next residue voltage based on a comparison of a magnitude of the input voltage (i.e., the initial residue voltage or a residue voltage from a preceding ADC stage) to the upper and lower residue voltage trip points (e.g., as shown in diagram 520 of FIG. 5).

Figure 4:
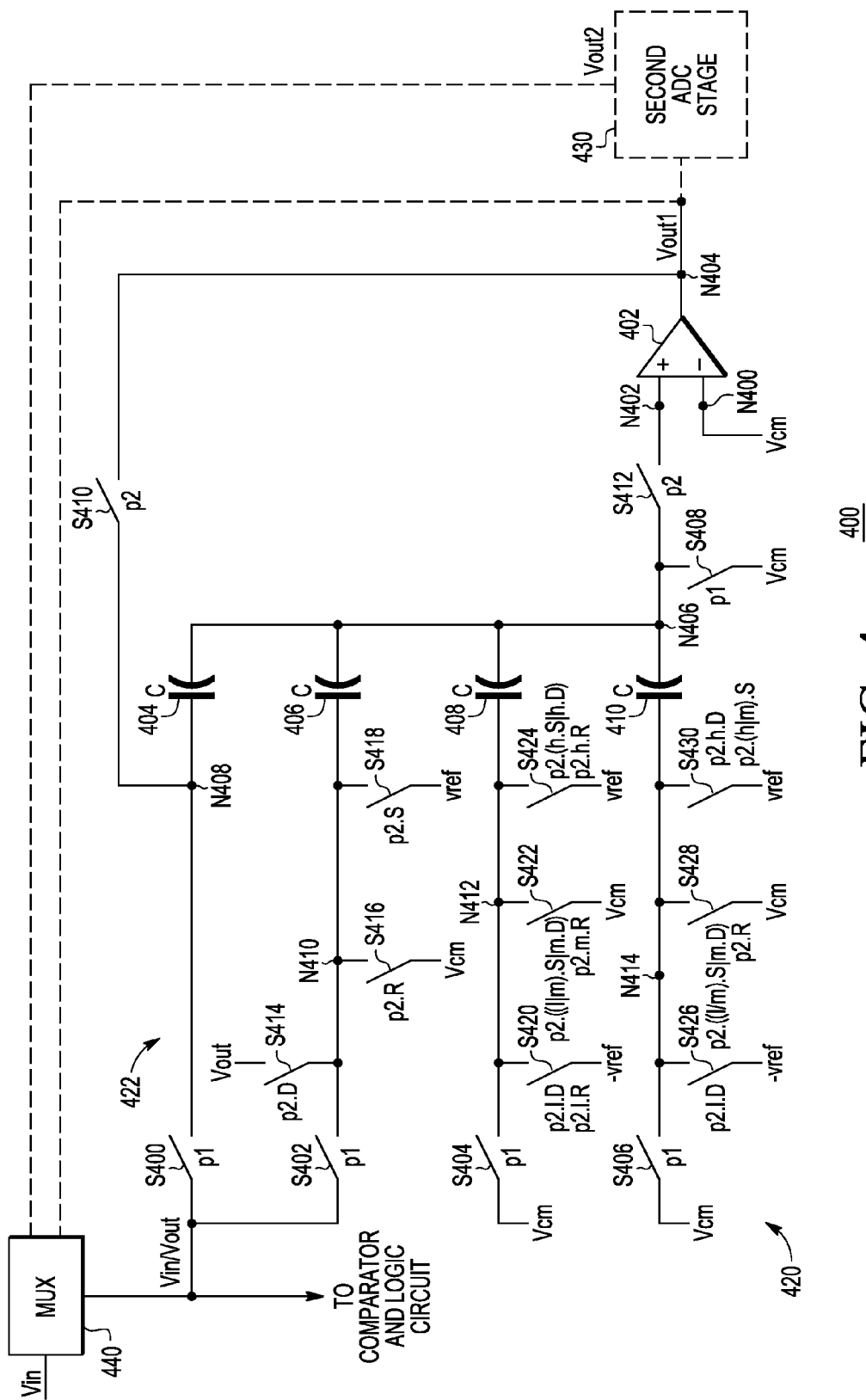
FIG. 4 is a circuit diagram illustrating an analog-to-digital converter having an ADC stage performing input voltage scaling and an initial residue voltage calculation in the same operation, in accordance with another embodiment.

Any of circuits 120-320 can be modified to enable this configuration from an initial ADC stage to a 1.5 bit RSD ADC circuit arrangement; FIG. 4 illustrates such a modification to circuit 320. More particularly, FIG. 4 illustrates is a circuit diagram of a cyclic ADC 400 having, in one embodiment: a first ADC stage 420, a second ADC stage 430, and a multiplexer ("mux") 440. The ADC stage 420 operates on an unscaled analog input voltage (Vin) that comprises either a single ended input voltage or a differential input voltage, during an initial residue calculation cycle and operates on a residue voltage (Vout) in subsequent residue calculation cycles. In the two-stage cyclic ADC embodiment, Vin is received into a first input of the multiplexer 440. An output of the ADC stage 430 (labeled as $V_{out2}$) is coupled to a second input of the multiplexer 440, and an output of the multiplexer 440 is coupled to an input of the ADC stage 420. The multiplexer 440 contains circuitry (such as one or more switches) to control whether the unscaled input voltage Vin or a residue voltage $V_{out2}$ from the ADC stage 430 is provided to the ADC stage 420. In an alternate single-stage cyclic ADC embodiment, an output of the ADC stage 420 (labeled as $V_{ain}$) is coupled to the second input of the multiplexer 440 for feeding the initial residue voltage and subsequent residue voltages generated by the ADC stage 420 back to the input of the ADC stage 420.

Figure 12:
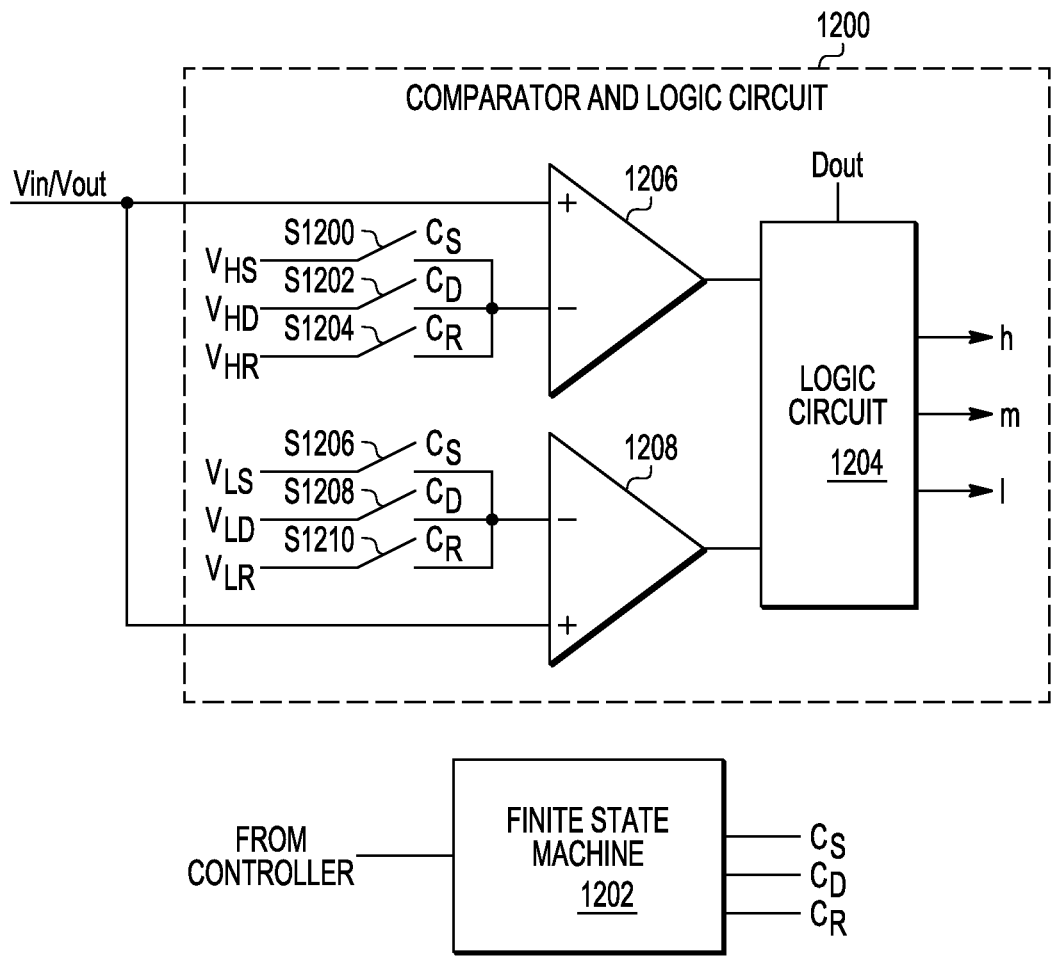
FIG. 12 is a diagram illustrating a comparator and logic circuit and controller that can be implemented by an ADC stage, in accordance with some embodiments.

ADC stage 420 includes a comparator and logic circuit having the configuration 1200 illustrated in FIG. 12 and a switched capacitor circuit 422 coupled to the comparator and logic circuit at a first voltage input (labeled as Vin/Vout) of the switched capacitor circuit. The switched capacitor circuit 422 further includes: a second voltage input (labeled as vref) for receiving a reference voltage; a third voltage input (labeled as −vref) for receiving a negative reference voltage, a voltage supply node N400 which is coupled to a common mode voltage $V_{CM}$, which in some implementations is a voltage that is approximately in the middle of the operating range of the ADC stage 420; a voltage output (which is an output $V_{out1}$ of the ADC stage 420) at a node N404; a plurality of coupled switches and capacitors, with the connectivity of these elements described below; and an operational amplifier 402 having an inverting input coupled to ("at") the node N400, a non-inverting input at a node N402, and an output terminal coupled to (and serving as) the voltage output ($V_{out1}$) of the switched capacitor circuit, at the node N404. The plurality of coupled capacitors comprises four capacitors 404, 406, 408, and 410 each having a same capacitance value and each having first and second terminals. As shown, all four capacitors have a first terminal coupled together at a node N406. The second terminal of the capacitor 404 is coupled to a node N408. The second terminal of the capacitor 406 is coupled to a node N410. The second terminal of the capacitor 408 is coupled to a node N412. The second terminal of the capacitor 410 is coupled to a node N414.

The plurality of coupled switches comprises a first set of switches (S400, S402, S404, S406, and S408) coupled to the first voltage input (Vin/Vout), the voltage supply node N400 and the four capacitors 404-410. The remainder of the plurality of coupled switches comprises a second set of switches (S410, S412, S414, S416, S418, S420, S422, S424, S426, S428, and S430) that includes a subset of the switches (S414, S416, S418, S420, S422, S424, S426, S328, and S430) that are selectively controlled by control signal (h, m, l) provided by the comparator and logic circuit 1200 and control signal ($C_S$, $C_D$, $C_R$) provided by the finite state machine 1202. The second set of switches (S410-S430) is coupled to the second voltage input (vref), the third voltage input (−vref), the voltage supply node N400, the four capacitors 404-410, and the non-inverting input at node N402 and the output (at $V_{out1}$) of the operational amplifier 402. Each switch has at least first and second terminals and can be implemented using any suitable transistor technology including, but not limited to, MOSFET technology.

The connectivity of the switches within this illustrative switched capacitor circuit is as follows. The first terminal of switch S400 is coupled to the first voltage input (Vin/Vout), and the second terminal is coupled to the node N408. The first terminal of switch S402 is coupled to the first voltage input (Vin/Vout), and the second terminal is coupled to the node N410. The first terminal of switch S404 is coupled to the voltage supply node, and the second terminal is coupled to the node N412. The first terminal of switch S406 is coupled to the voltage supply node, and the second terminal is coupled to the node N414. The first terminal of switch S408 is coupled to the voltage supply node, and the second terminal is coupled to the node N406. The first terminal of switch S410 is coupled to the node N408, and the second terminal is coupled to the output of the operational amplifier 402 at the node N404. The first terminal of switch S412 is coupled to the node N406, and the second terminal is coupled to the non-inverting input of the operational amplifier 402 at the node N402. The first terminal of switch S414 is coupled to the output ($V_{out1}$), and the second terminal is coupled to the node N410. The first terminal of switch S416 is coupled to the voltage supply node, and the second terminal is coupled to the node N410. The first terminal of switch S418 is coupled to the second voltage input (vref), and the second terminal is coupled to the node N410. The first terminal of switch S420 is coupled to the third voltage input (−vref), and the second terminal is coupled to the node N412. The first terminal of switch S422 is coupled to the voltage supply node, and the second terminal is coupled to the node N412. The first terminal of switch S424 is coupled to the second voltage input (vref), and the second terminal is coupled to the node N412. The first terminal of switch S426 is coupled to the third voltage input (−vref), and the second terminal is coupled to the node N414. The first terminal of switch S428 is coupled to the voltage supply node, and the second terminal is coupled to the node N414. The first terminal of switch S430 is coupled to the second voltage input (vref), and the second terminal is coupled to the node N414.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S400-S408 (also referred to herein as sampling control switches) is governed by a sampling control clock signal p1. The second set of switches S410-S430 (also referred to herein as gain control switches) is governed by a gain control clock signal p2. In addition, the gain control switches may be labeled with an "S", a "D", or an "R". More particularly, a gain control switch labeled with only an "S" is controlled to close only when the control signal $C_S$ (FIG. 12) is high and is used only when operating on a single ended input voltage. A gain control switch labeled with only a "D" is controlled to close only when the control signal $C_D$ (FIG. 12) is high and is used only when operating on a differential input voltage. A gain control switch labeled with only an "R" is controlled to close only when the control signal $C_R$ (FIG. 12) is high and is used only when operating on a residue input voltage. A gain control switch labeled with a combination of an "S", "D" and/or "R" is used when operating either on a single ended, a differential or a residue input voltage, depending on the particular control (h, m, or l) signal applied to the switch. A gain control switch having no "S", "D" or "R" is used during all residue calculation cycles.

Moreover, the subset (S420-S430) of the switches is governed by control signals h, m, and l as follows. Switch S420 is controlled to close by control signal l when operating on a differential or residue signal. Switch S422 is controlled to close by control signal m when operating any one of a single ended, differential or residue signal and by control signal l when operating on a single ended signal. Switch S424 is controlled to close by control signal h when operating on any one of a single ended, differential or residue signal. Switch S426 is controlled to close by control signal l when operating on a differential signal. Switch S428 is controlled to close by control signal m when operating on a differential signal and by control signal l when operating on a single ended signal. Switch S430 is controlled to close by control signal m when operating on a single ended signal and by a control signal h when operating on either a single ended or differential signal.

During operation as an initial ADC stage, circuit 420 functions as does the circuit 320 of FIG. 3, as described above and not repeated here for the sake of brevity. During operation as the 1.5 bit RSD ADC stage, the first set of switches (S400-S408) is configured to close under the control of the sampling control clock signal p1 during the sample cycle to charge the capacitors 404 and 406 in order to sample a residue input voltage at the first voltage input (Vin/Vout), thereby generating a residue input voltage sample. The residue input voltage comprises the initial residue voltage or a subsequent residue voltage generated by ADC stage 420 when $V_{out1}$ is coupled to the multiplexer 440 or comprises the residue voltage $V_{out2}$ generated by the second ADC stage 430, in the two-stage ADC embodiment. Upon the conclusion of the sample cycle when control signal p1 controls the first set of switches to open, the second set of switches (S410-S430) is configured to selectively close under the control of the gain control clock signal p2 and one or more control signals (h, m, l, $C_R$) to generate an output residue voltage based on the comparison of the magnitude of the residue input voltage to the first upper and lower residue voltage trip points (e.g., as shown in diagram 520 of FIG. 5). The magnitude of the output residue voltage is determined in accordance with the following equations: when Vin>Vh, Vout=2Vin−vref; when Vh>Vin>Vl, Vout=2Vin; and when Vin<Vl, Vout=2Vin+vref, wherein Vin is the magnitude of the residue input voltage, Vout is the magnitude of the output residue voltage, vref is a magnitude of the reference voltage, Vh is the upper residue voltage trip point, and Vl is the lower residue voltage trip point.

FIG. 6 to FIG. 10 illustrate embodiments of the present teachings that integrate input voltage scaling, reference voltage scaling and an initial residue voltage calculation within the same operation, i.e., the initial residue calculation cycle. As mentioned earlier, some of these embodiments are more suitable to implementation in cyclic ADCs. Therefore, the circuit arrangements 600-900 illustrated, respectively, in FIGS. 6-9 comprise cyclic ADCs, which in one embodiment comprises single-stage cyclic ADCs and in an alternative embodiment comprises two-stage ADCs. More particularly, a single ADC stage (e.g., ADC stages 620, 720, 820, and 920) is used as the initial stage of the ADC for the initial residue calculation cycle and then reconfigured to have a circuit arrangement that does not scale the input and reference voltages, such as 1.5 bit RSD ADC circuit arrangement, described above, for subsequent residue calculation cycles. To enable the ADC stages 620, 720, 820, and 920, each of these stages comprises a comparator and logic circuit, configured with multiple upper and lower trip point sets, which operates similar to the comparator and logic circuit 1200 of FIG. 12, the description of which is not repeated here for the sake of brevity.

Figure 8:
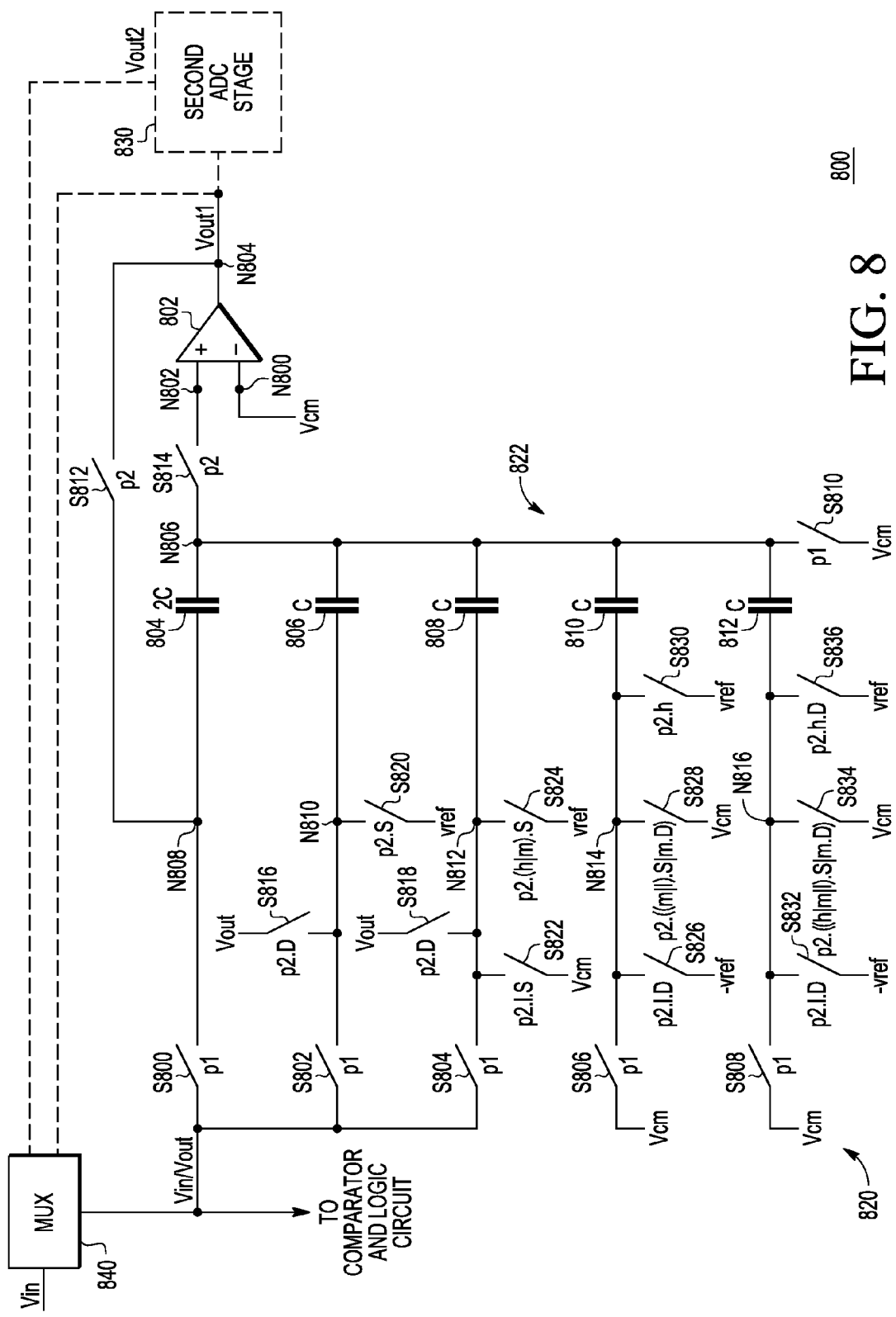
FIG. 8 is a circuit diagram illustrating an analog-to-digital converter having an ADC stage performing input voltage and reference voltage scaling and an initial residue voltage calculation in the same operation, in accordance with another embodiment.
Figure 9:
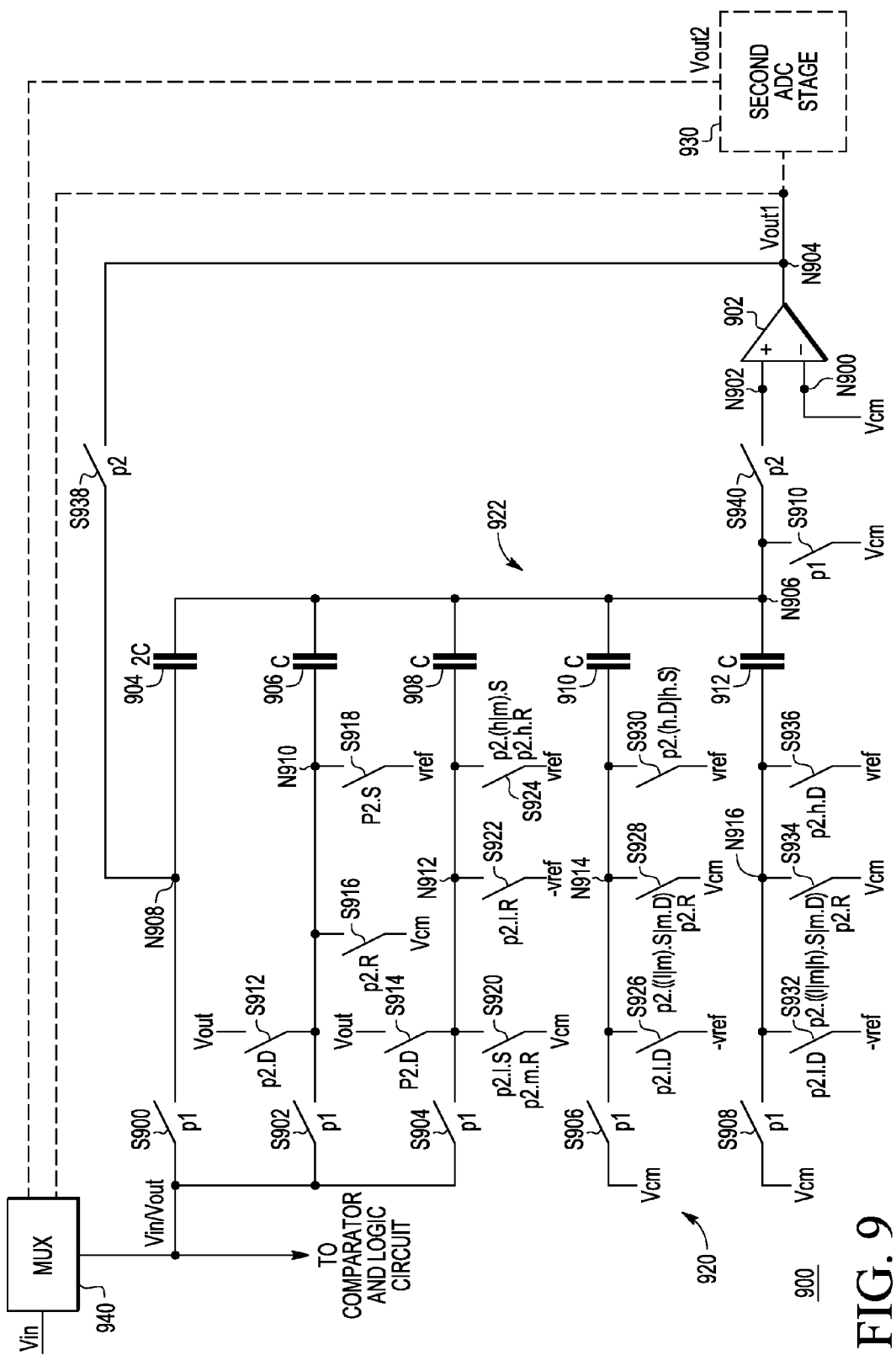
FIG. 9 is a circuit diagram illustrating an analog-to-digital converter having an ADC stage performing input voltage and reference voltage scaling and an initial residue voltage calculation in the same operation, in accordance with another embodiment.
Figure 10:
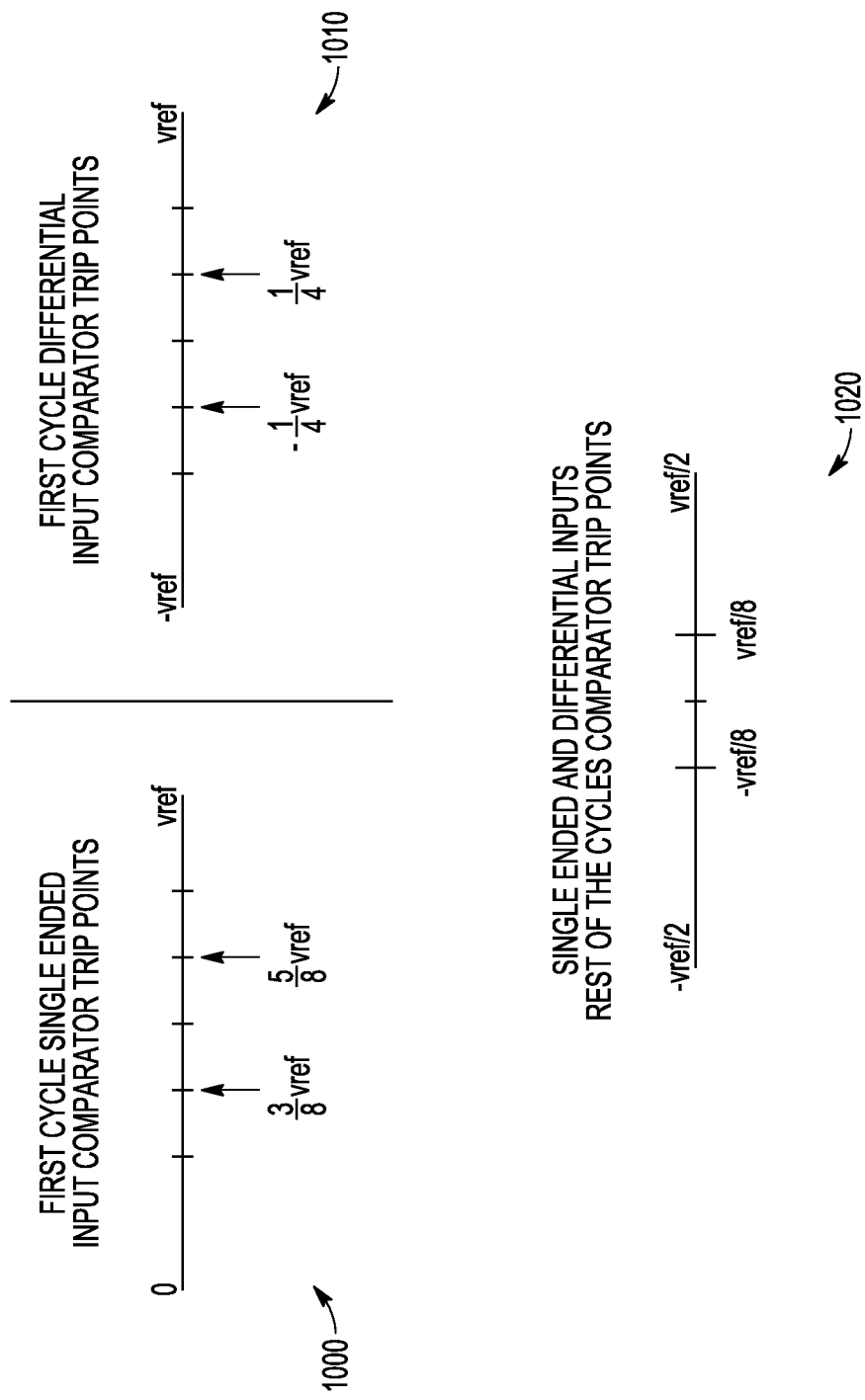
FIG. 10 is a diagram depicting comparator trip points for unscaled single ended and differential input voltages processed using the analog-to-digital converters shown in FIG. 6 to FIG. 9, in accordance with an embodiment.

Turning momentarily to FIG. 10, shown therein are diagrams 1000, 1010, and 1020 depicting three example voltage trip point configurations for the comparator and logic circuit 1200 when the initial ADC stage performs unscaled input voltage scaling, reference voltage scaling, and initial residue calculation during the initial residue calculation cycle, as described for instance by reference to FIG. 6 to FIG. 9. In accordance with the present teachings, ADC embodiments have the capability of handling both single ended input voltages and differential input voltages. Thus, in an embodiment (e.g., ADC implementations shown in FIGS. 6, 8, and 9), the comparator and logic circuit 1200 is configured with first upper and lower unscaled voltage trip points, for instance the voltage trip points having values ($V_H$=⅝vref and $V_L$=⅜vref from a range of 0 to vref) shown in diagram 1000, to process a single ended input voltage prior to the initial residue calculation cycle. Vref is a reference voltage provided to the switched capacitor circuit of the ADC stages. The comparator and logic circuit 1200 is further configured (e.g., for ADC implementations shown in FIGS. 7-9) with second upper and lower unscaled voltage trip points that are different than the first upper and lower unscaled voltage trip points, for instance the voltage trip points having values ($V_H$=¼vref and $V_L$=−¼vref from a range of −vref to vref) shown in diagram 1010, to process a differential input voltage prior to the initial residue calculation cycle. Moreover, the comparator and logic circuit 1200 is configured (e.g., for ADC implementations shown in FIGS. 6-9) with upper and lower residue voltage trip points that are different than the first and second upper and lower unscaled voltage trip points, for instance the voltage trip points having values ($V_H$=⅛vref and $V_L$=−⅛vref from a range of −vref/2 to vref/2) shown in diagram 1020, to process residue voltages after the initial residue calculation cycle and for each remaining residue calculation cycle of the ADC process.

Figure 6:
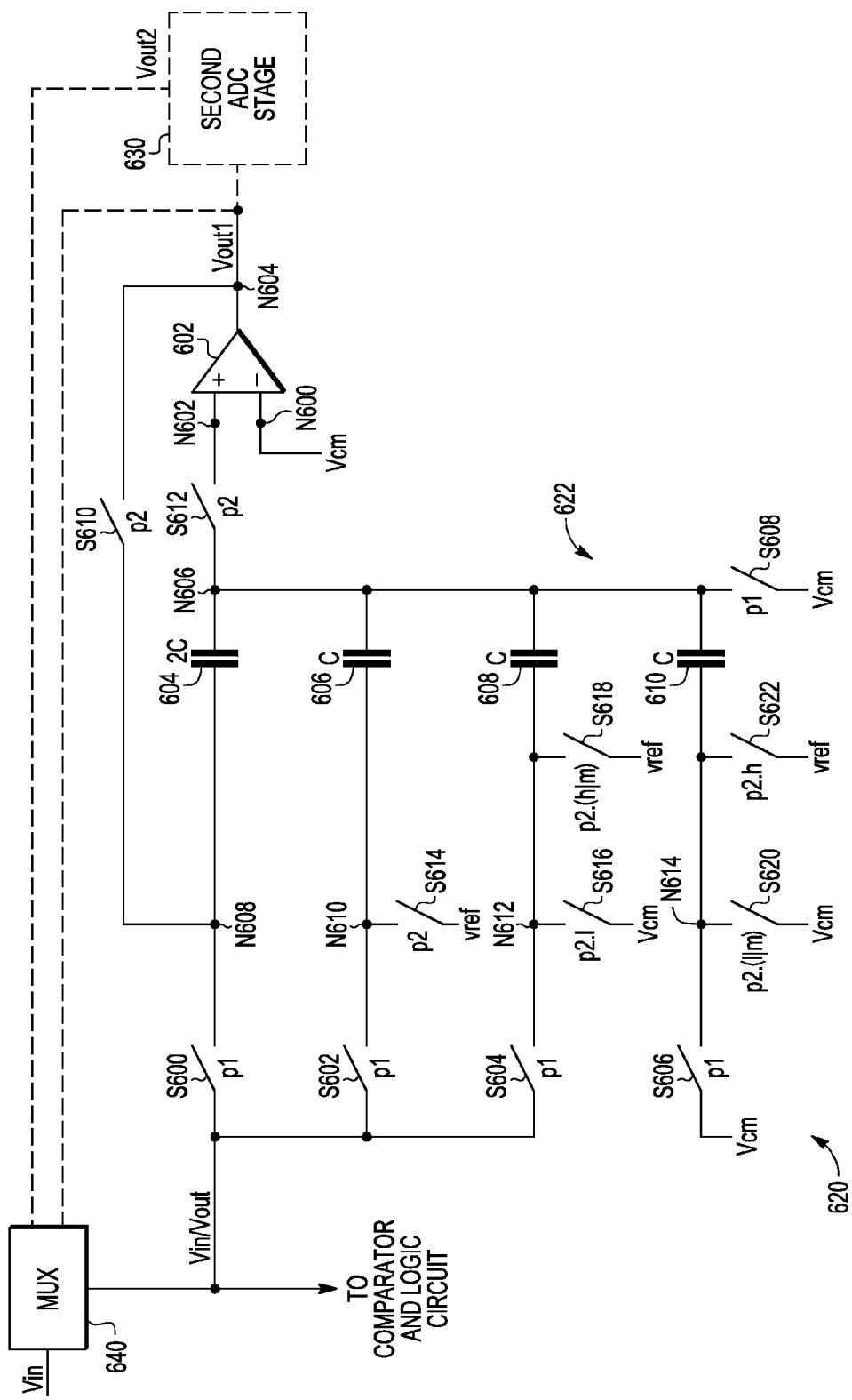
FIG. 6 is a circuit diagram illustrating an analog-to-digital converter having an ADC stage performing input voltage and reference voltage scaling and an initial residue voltage calculation in the same operation, in accordance with an embodiment.

Turning now to FIG. 6, shown therein is a circuit diagram illustrating a cyclic ADC 600 having an initial ADC stage 620 performing input and reference voltage scaling and an initial residue voltage calculation in the same operation, in accordance with another embodiment. The ADC stage 620 operates on an unscaled analog input voltage (Vin) that comprises a single ended input voltage, during the initial residue calculation cycle. Thereafter, during subsequent residue calculation cycles, the ADC stage 620 is reconfigured using the control signal $C_R$ (FIG. 12) to receive a residue voltage at its input (labeled Vin/Vout) and to generate a next residue voltage at its output (labeled $V_{out1}$), without scaling the input voltage. The ADC stage 620 maintains this configuration until the next unscaled input voltage sample is taken, wherein the ADC stage 620 is reconfigured using the control signal $C_S$ (FIG. 12) to generate another initial residue voltage. The ADC 600 further includes a multiplexer 640 having a first input coupled to receive the analog input voltage Vin, a second input coupled to receive a residue voltage and an output coupled to the input of the ADC stage 620. The multiplexer 640 contains circuitry (such as one or more switches) to control whether the unscaled input voltage or a residue voltage is provided at the input of the ADC stage 620. In a single-stage cyclic ADC 600 embodiment, initial and subsequent residue voltages ($V_{out1}$) output by the ADC stage 620 are coupled to the second input of the multiplexer 640. In a two-stage cyclic ADC embodiment, the ADC 600 comprises a second ADC stage 630 that provides residue voltages $V_{out2}$ to the second input of the multiplexer 640. The ADC stage 630, in one embodiment, operates as a known 1.5 bit RSD ADC.

ADC stage 620 includes a comparator and logic circuit (not shown) that can be configured, as the comparator and logic circuit 1200 of FIG. 12, with upper and lower unscaled voltage trip points $V_{HS}$ and $V_{LS}$ (having values, for instance, as shown in diagram 1000 of FIG. 10) prior to the initial residue calculation and configured with upper and lower residue voltage trip points $V_{HR}$ and $V_{LR}$ (having values, for instance, as shown in diagram 1020 of FIG. 10) for enabling the calculation of residue voltages. The ADC stage 620 further comprises a switched capacitor circuit 622 coupled to the comparator and logic circuit at a first voltage input (labeled as Vin/Vout) of the switched capacitor circuit. For ease of description only the circuit schematic of the switched capacitor circuit 622 when the ADC stage 620 functions as the initial ADC stage is shown and described. An example of additional circuitry to enable the ADC stage to be reconfigured from an initial stage to generate residue voltages for subsequent residue calculation cycles is shown by reference to FIG. 9.

The switched capacitor circuit 622 further includes: a second voltage input (labeled as vref) for receiving a reference voltage; a voltage supply node N600 which is coupled to a common mode voltage $V_{CM}$, which in some implementations is a voltage that is approximately in the middle of the operating range of the ADC stage 620; a voltage output (which is an output $V_{out1}$ of the ADC stage 620 at a node N604); a plurality of coupled switches and capacitors, with the connectivity of these elements described below; and an operational amplifier 602 having an inverting input coupled to ("at") the node N600, a non-inverting input at a node N602, and an output terminal coupled to (and serving as) the voltage output ($V_{out1}$) of the switched capacitor circuit, at the node N604. The plurality of coupled capacitors comprises four capacitors 604, 606, 608, and 610, with three of the capacitors (606, 608, and 610) having a same first capacitance value and the fourth capacitor 604 having twice the first capacitance value; and with each capacitor 604-610 having first and second terminals. As shown, all four capacitors have a first terminal coupled together at a node N606. The second terminal of the capacitor 604 is coupled to a node N608. The second terminal of the capacitor 606 is coupled to a node N610. The second terminal of the capacitor 608 is coupled to a node N612. The second terminal of the capacitor 610 is coupled to a node N614.

The plurality of coupled switches comprises a first set of switches (S600, S602, S604, S606, and S608) coupled to the first voltage input (Vin/Vout), the voltage supply node N600 and the four capacitors 604-610. The remainder of the plurality of coupled switches comprises a second set of switches (S610, S612, S614, S616, S618, S620, and S622) that includes a subset of the switches (S616, S618, S620, and S622) that are selectively controlled by the voltage scaling and gain control signal (h, m, l) provided by the comparator and logic circuit 112. The second set of switches (S610-S622) is coupled to the second voltage input (vref), the voltage supply node N600, the four capacitors 604-610, and the non-inverting input at node N602 and the output (at $V_{out1}$) of the operational amplifier 602. Each switch has at least first and second terminals and can be implemented using any suitable transistor technology including, but not limited to, MOSFET technology.

The connectivity of the switches within this illustrative switched capacitor circuit is as follows. The first terminal of switch S600 is coupled to the first voltage input (Vin/Vout), and the second terminal is coupled to the node N608. The first terminal of switch S602 is coupled to the first voltage input (Vin/Vout), and the second terminal is coupled to the node N610. The first terminal of switch S604 is coupled to the first voltage input (Vin/Vout), and the second terminal is coupled to the node N612. The first terminal of switch S606 is coupled to the voltage supply node, and the second terminal is coupled to the node N614. The first terminal of switch S608 is coupled to the voltage supply node, and the second terminal is coupled to the node N606. The first terminal of switch S610 is coupled to the node N608, and the second terminal is coupled to the output of the operational amplifier 602 at the node N604. The first terminal of switch S612 is coupled to the node N606, and the second terminal is coupled to the non-inverting input of the operational amplifier 602 at the node N602. The first terminal of switch S614 is coupled to the second voltage input (vref), and the second terminal is coupled to the node N610. The first terminal of switch S616 is coupled to the voltage supply node, and the second terminal is coupled to the node N612. The first terminal of switch S618 is coupled to the second voltage input (vref), and the second terminal is coupled to the node N612. The first terminal of switch S620 is coupled to the voltage supply node, and the second terminal is coupled to the node N614. The first terminal of switch S622 is coupled to the second voltage input (vref), and the second terminal is coupled to the node N614.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S600-S608 (also referred to herein as sampling control switches) is governed by a sampling control clock signal p1. The second set of switches S610-S622 (also referred to herein as gain control switches) is governed by a gain control clock signal p2. The subset (S616-S622) of the switches is governed by control signals h, m, and l with: switch S616 being controlled to close by control signal l; switch S618 being controlled to close by control signals h or m; switch S620 being controlled to close by control signal l; and switch S622 being controlled to close by control signal h.

During operation of the initial ADC stage 620, during the same main clock period in which the comparator and digital circuit 1200 generates the initial output bit, the first set of switches (S600-S608) is configured to close under the control of the sampling control clock signal p1 during the sample cycle to charge the capacitors 604-608 in order to sample an unscaled input voltage at the first voltage input (Vin/Vout), thereby generating an unscaled input voltage sample. Upon the conclusion of the sample cycle when control signal p1 controls the first set of switches to open, the second set of switches (S610-S622) is configured to selectively close under the control of the gain control clock signal p2 and the voltage scaling and gain control signal (h, m, or l), generated by the comparator and logic circuit 1200 during the initial main clock period that initiated the ADC process, to scale the unscaled input voltage sample and the reference voltage and generate the initial residue voltage based on the comparison of the magnitude of the unscaled input voltage to the first upper and lower unscaled voltage trip points (e.g., as shown in diagram 1000 of FIG. 10).

In the illustrative circuit arrangement 620, during the initial residue calculation phase and when the unscaled input voltage comprises a single ended input voltage, the switched capacitor circuit generates the initial residue voltage at the node N104 having a magnitude determined by and in accordance with the following sets of equations:

$$\text{when, } Vin > Vh \qquad (7)$$
$$Vout = 2\left(Vin - \frac{vref}{2}\right) - \frac{vref}{2};$$
$$2Vout = 4Vin - 3vref$$

-continued when, $Vh > Vin > V1$ (8)

$$Vout = 2\left(Vin - \frac{vref}{2}\right);$$
$$Vout = 4Vin - 20vref$$

when, $Vin < V1$ (9)

$$Vout = 2\left(Vin - \frac{vref}{2}\right) + \frac{vref}{2},$$
$$2Vout = 4Vin - vref$$

wherein Vin is the magnitude of the unscaled input voltage, Vout is the initial residue magnitude, vref is a magnitude of the reference voltage, Vh is the upper unscaled voltage trip point, and Vl is the lower unscaled voltage trip point. In the sets of equations (7), (8), and (9), the magnitude (Vin) of the unscaled input voltage is scaled by (−2vref) and the reference voltage is scaled by (½) to maintain the input and reference voltages within operating range of the operational amplifier 102. The residue voltage is provided to the next ADC stage 630 or the multiplexer 640, depending on the embodiment.

Figure 7:
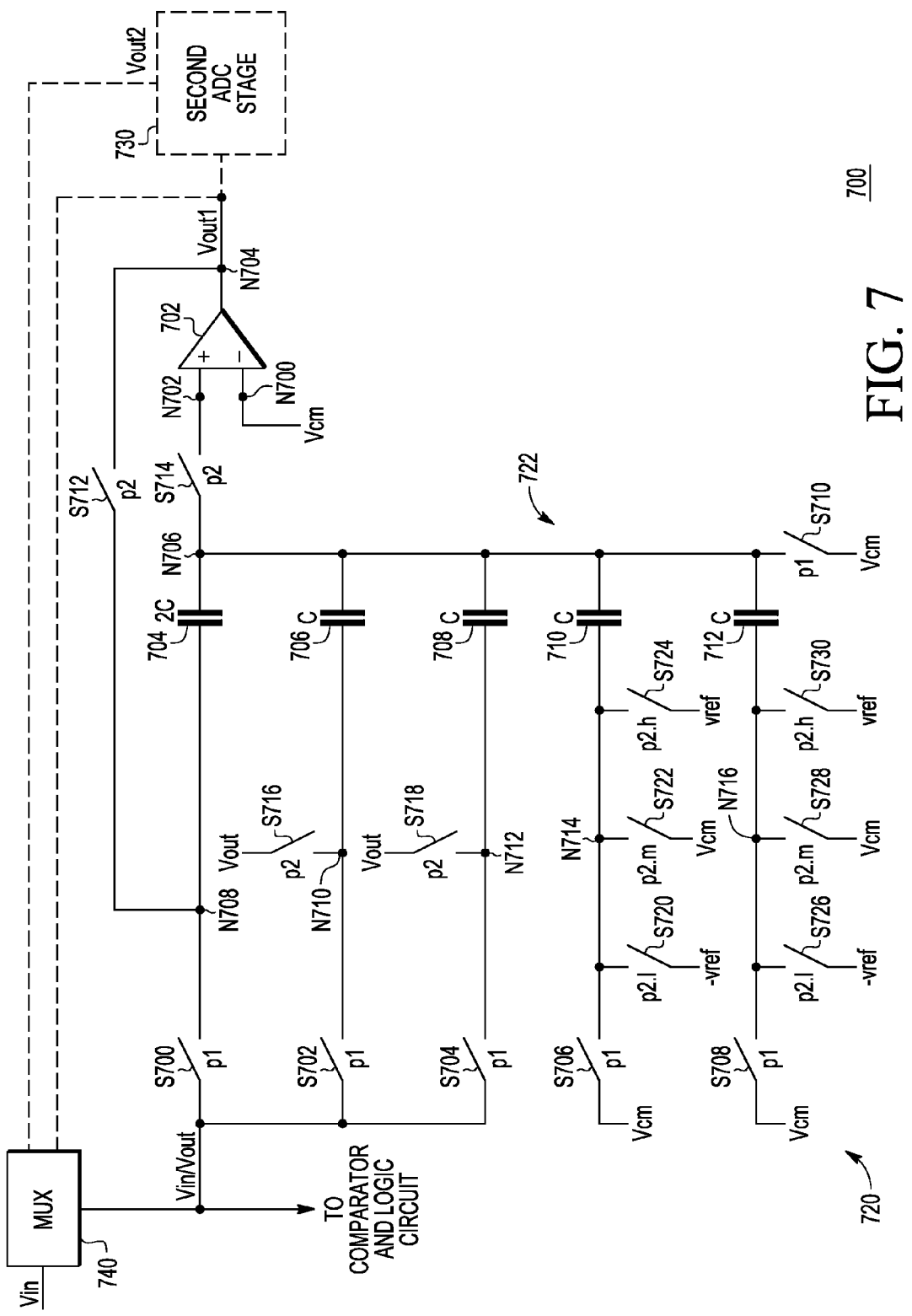
FIG. 7 is a circuit diagram illustrating an analog-to-digital converter having an ADC stage performing input voltage and reference voltage scaling and an initial residue voltage calculation in the same operation, in accordance with another embodiment.

Turning now to FIG. 7, shown therein is a circuit diagram illustrating a cyclic ADC 700 comprising an initial ADC stage 720 performing input and reference voltage scaling and an initial residue voltage calculation in the same operation, in accordance with another embodiment. The ADC stage 720 operates on an unscaled analog input voltage that comprises a differential input voltage, during the initial residue calculation cycle. Thereafter, during subsequent residue calculation cycles, the ADC stage 720 is reconfigured using the control signal $C_R$ (FIG. 12) to receive a residue voltage at its input (labeled Vin/Vout) and to generate a next residue voltage at its output (labeled $V_{out1}$), without scaling the input voltage. The ADC stage 720 maintains this configuration until the next unscaled input voltage sample is taken, wherein the ADC stage 720 is reconfigured using the control signal $C_D$ (FIG. 12) to generate another initial residue voltage. The ADC 700 further includes a multiplexer 740 having a first input coupled to receive the analog input voltage Vin, a second input coupled to receive a residue voltage and an output coupled to the input of the ADC stage 720. The multiplexer 740 contains circuitry (such as one or more switches) to control whether the unscaled input voltage or a residue voltage is provided at the input of the ADC stage 720. In a single-stage cyclic ADC 700 embodiment, initial and subsequent residue voltages ($V_{out1}$) output by the ADC stage 720 are coupled to the second input of the multiplexer 740. In a two-stage cyclic ADC embodiment, the ADC 700 comprises a second ADC stage 730 that provides residue voltages $V_{out2}$ to the second input of the multiplexer 740. The ADC stage 730, in one embodiment, operates as a known 1.5 bit RSD ADC.

ADC stage 720 includes a comparator and logic circuit (not shown) that can be configured, as the comparator and logic circuit 1200 of FIG. 12, with upper and lower unscaled voltage trip points $V_{HD}$ and $V_{LD}$ (having values, for instance, as shown in diagram 1010 of FIG. 10) prior to the initial residue calculation and configured with upper and lower residue voltage trip points $V_{HR}$ and $V_{LR}$ (having values, for instance, as shown in diagram 1020 of FIG. 10) for enabling the calculation of residue voltages. The ADC stage 720 further comprises a switched capacitor circuit 722 coupled to the comparator and logic circuit at a first voltage input (labeled as Vin/Vout) of the switched capacitor circuit. For ease of description only the circuit schematic of the switched capacitor circuit 722 when the ADC stage 720 functions as the initial ADC stage is shown and described. An example of additional circuitry to enable an ADC stage to be reconfigured from an initial stage to generate residue voltages for subsequent residue calculation cycles is shown by reference to FIG. 9.

The switched capacitor circuit 722 further includes: a second voltage input (labeled as vref) for receiving a reference voltage; a third voltage input (labeled as −vref) for receiving a negative reference voltage, a voltage supply node N700 which is coupled to a common mode voltage $V_{CM}$, which in some implementations is a voltage that is approximately in the middle of the operating range of the ADC stage 720); a voltage output (which is an output $V_{out1}$ of the ADC stage 720) at a node N704; a plurality of coupled switches and capacitors, with the connectivity of these elements described below; and an operational amplifier 702 having an inverting input coupled to ("at") the node N700, a non-inverting input at a node N702, and an output terminal coupled to (and serving as) the voltage output ($V_{out1}$) of the switched capacitor circuit, at the node N704. The plurality of coupled capacitors comprises five capacitors 704, 706, 708, 710, and 712, with four of the capacitors (706, 708, 710, and 712) having a same first capacitance value and the fifth capacitor 704 having twice the first capacitance value; and with each capacitor having first and second terminals. As shown, all five capacitors have a first terminal coupled together at a node N706. The second terminal of the capacitor 704 is coupled to a node N708. The second terminal of the capacitor 706 is coupled to a node N710. The second terminal of the capacitor 708 is coupled to a node N712. The second terminal of the capacitor 710 is coupled to a node N714. The second terminal of the capacitor 712 is coupled to a node N716.

The plurality of coupled switches comprises a first set of switches (S700, S702, S704, S706, S708, and S710) coupled to the first voltage input (Vin/Vout), the voltage supply node N700 and the five capacitors 704-712. The remainder of the plurality of coupled switches comprises a second set of switches (S712, S714, S716, S718, S720, S722, S724, S726, S728, and S730) that includes a subset of the switches (S720, S722, S724, S726, S728, and S730) that are selectively controlled by the voltage scaling and gain control signal (h, m, l) provided by the comparator and logic circuit 1200. The second set of switches (S712-S730) is coupled to the second voltage input (vref), the third voltage input (−vref), the voltage supply node N700, the five capacitors 704-712, and the non-inverting input at node N702 and the output (at $V_{out1}$) of the operational amplifier 702. Each switch has at least first and second terminals and can be implemented using any suitable transistor technology including, but not limited to, MOSFET technology.

The connectivity of the switches within this illustrative switched capacitor circuit is as follows. The first terminal of switch S700 is coupled to the first voltage input (Vin/Vout), and the second terminal is coupled to the node N708. The first terminal of switch S702 is coupled to the first voltage input (Vin), and the second terminal is coupled to the node N710. The first terminal of switch S704 is coupled to the first voltage input (Vin/Vout), and the second terminal is coupled to the node N712. The first terminal of switch S706 is coupled to the voltage supply node, and the second terminal is coupled to the node N714. The first terminal of switch S708 is coupled to the voltage supply node, and the second terminal is coupled to the node N716. The first terminal of switch S710 is coupled to the voltage supply node, and the second terminal is coupled to the node N706. The first terminal of switch S712 is coupled to the node N708, and the second terminal is coupled to the output of the operational amplifier 702 at the node N704. The first terminal of switch S714 is coupled to the node N706, and the second terminal is coupled to the non-inverting input of the operational amplifier 702 at the node N702. The first terminal of switch S716 is coupled to the output ($V_{out1}$), and the second terminal is coupled to the node N710. The first terminal of switch S718 is coupled to the output ($V_{out1}$), and the second terminal is coupled to the node N712. The first terminal of switch S720 is coupled to the third voltage input (−vref), and the second terminal is coupled to the node N714. The first terminal of switch S722 is coupled to the voltage supply node, and the second terminal is coupled to the node N714. The first terminal of switch S724 is coupled to the second voltage input (vref), and the second terminal is coupled to the node N714. The first terminal of switch S726 is coupled to the third voltage input (−vref), and the second terminal is coupled to the node N716. The first terminal of switch S728 is coupled to the voltage supply node, and the second terminal is coupled to the node N716. The first terminal of switch S730 is coupled to the second voltage input (vref), and the second terminal is coupled to the node N716.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S700-S710 (also referred to herein as sampling control switches) is governed by a sampling control clock signal p1. The second set of switches S712-S730 (also referred to herein as gain control switches) is governed by a gain control clock signal p2. The subset (S720-S730) of the switches is governed by control signals h, m, and l with: switch S720 being controlled to close by control signal l; switch S722 being controlled to close by control signal m; switch S724 being controlled to close by control signal h; and switch S726 being controlled to close by control signal l; switch S728 being controlled to close by control signal m; and switch S730 being controlled to close by control signal h.

During operation of the initial ADC stage 720, during the same main clock period in which the comparator and digital circuit 1200 generates the initial output bit, the first set of switches (S700-S710) is configured to close under the control of the sampling control clock signal p1 during the sample cycle to charge the capacitors 704-708 in order to sample an unscaled input voltage at the first voltage input (Vin), thereby generating an unscaled input voltage sample. Upon the conclusion of the sample cycle when control signal p1 controls the first set of switches to open, the second set of switches (S712-S730) is configured to selectively close under the control of the gain control clock signal p2 and the voltage scaling and gain control signal (h, m, or l), generated by the comparator and logic circuit 1200 during the initial main clock period that initiated the ADC process, to scale the unscaled input voltage sample and the reference voltage and generate the initial residue voltage based on the comparison of the magnitude of the unscaled input voltage to the first upper and lower unscaled voltage trip points (e.g., as shown in diagram 1010 of FIG. 10).

In the illustrative circuit arrangement 720, during the initial residue calculation cycle and when the unscaled input voltage comprises a differential input voltage, the switched capacitor circuit generates the initial residue voltage at the node N704 having a magnitude determined by and in accordance with the following sets of equations:

when, $Vin > Vh$ (10)
$$Vout = 2\left(\frac{Vin}{2}\right) - \frac{vref}{2};$$
$$4Vout = 4Vin - 2vref$$

when, $Vh > Vin > V1$ (11)
$$Vout = 2\left(\frac{Vin}{2}\right);$$
$$4Vout = 4Vin$$

when, $Vin < V1$ (12)
$$Vout = 2\left(\frac{Vin}{2}\right) + \frac{vref}{2},$$
$$4Vout = 4Vin + 2vref$$

wherein Vin is the magnitude of the unscaled input voltage, Vout is the initial residue magnitude, vref is a magnitude of the reference voltage, Vh is the upper unscaled voltage trip point, and Vl is the lower unscaled voltage trip point. In the sets of equations (10), (11), and (12), the magnitude (Vin) of the unscaled input voltage is scaled by (½) and the reference voltage is scaled by (½) to maintain the input and reference voltages within operating range of the operational amplifier 702. The residue voltage is provided to the next ADC stage 730 or to the multiplexer 740, depending on the embodiment.

Turning now to FIG. 8, shown therein is a circuit diagram illustrating an initial ADC stage 820 performing input and reference voltage scaling and an initial residue voltage calculation in the same operation, in accordance with another embodiment. The ADC stage 820 operates on an unscaled analog input voltage that comprises either a single ended input voltage or a differential input voltage, during the initial residue calculation cycle. Thereafter, during subsequent residue calculation cycles, the ADC stage 820 is reconfigured using the control signal $C_R$ (FIG. 12) to receive a residue voltage at its input (labeled Vin/Vout) and to generate a next residue voltage at its output (labeled $V_{out1}$), without scaling the input voltage. The ADC stage 820 maintains this configuration until the next unscaled input voltage sample is taken, wherein the ADC stage 820 is reconfigured using the control signal $C_S$ or $C_D$ (FIG. 12), depending on whether the unscaled input signal was single ended or differential, to generate another initial residue voltage. The ADC 800 further includes a multiplexer 840 having a first input coupled to receive the analog input voltage Vin, a second input coupled to receive a residue voltage and an output coupled to the input of the ADC stage 820. The multiplexer 840 contains circuitry (such as one or more switches) to control whether the unscaled input voltage or a residue voltage is provided at the input of the ADC stage 820. In a single-stage cyclic ADC 800 embodiment, initial and subsequent residue voltages ($V_{out1}$) output by the ADC stage 820 are coupled to the second input of the multiplexer 840. In a two-stage cyclic ADC embodiment, the ADC 800 comprises a second ADC stage 830 that provides residue voltages $V_{out2}$ to the second input of the multiplexer 840. The ADC stage 830, in one embodiment, operates as a known 1.5 bit RSD ADC.

ADC stage 820 includes a comparator and logic circuit (not shown) that can be configured, as the comparator and logic circuit 1200 of FIG. 12, with upper and lower unscaled voltage trip points $V_{HS}$ and $V_{LS}$ or $V_{HD}$ and $V_{LD}$ (having values, for instance, as shown in diagram 1000 or 1010 of FIG. 10) prior to the initial residue calculation and configured with upper and lower residue voltage trip points $V_{HR}$ and $V_{LR}$ (having values, for instance, as shown in diagram 1020 of FIG. 10) for enabling the calculation of residue voltages. The ADC stage 820 further comprises a switched capacitor circuit 822 coupled to the comparator and logic circuit at a first voltage input (labeled as Vin/Vout) of the switched capacitor circuit. For ease of description only the circuit schematic of the switched capacitor circuit 822 when the ADC stage 820 functions as the initial ADC stage is shown and described. An example of additional circuitry to enable the ADC stage to be reconfigured from an initial stage to generate residue voltages for subsequent residue calculation cycles is shown by reference to FIG. 9.

The switched capacitor circuit 822 further includes: a second voltage input (labeled as vref) for receiving a reference voltage; a third voltage input (labeled as −vref) for receiving a negative reference voltage, a voltage supply node N800 which is coupled to a common mode voltage $V_{CM}$, which in some implementations is a voltage that is approximately in the middle of the operating range of the operational amplifier 802); a voltage output (which is an output $V_{out1}$ of the ADC stage 820) at a node N804; a plurality of coupled switches and capacitors, with the connectivity of these elements described below; and an operational amplifier 802 having an inverting input coupled to ("at") the node N800, a non-inverting input at a node N802, and an output terminal coupled to (and serving as) the voltage output ($V_{out1}$) of the switched capacitor circuit, at the node N804. The plurality of coupled capacitors comprises five capacitors 804, 806, 808, 810, and 812, with four of the capacitors having a same first capacitance value and the fifth capacitor having twice the first capacitance value, and each having first and second terminals. As shown, all five capacitors have a first terminal coupled together at a node N806. The second terminal of the capacitor 804 is coupled to a node N808. The second terminal of the capacitor 806 is coupled to a node N810. The second terminal of the capacitor 808 is coupled to a node N812. The second terminal of the capacitor 810 is coupled to a node N814. The second terminal of the capacitor 812 is coupled to a node N816.

The plurality of coupled switches comprises a first set of switches (S800, S802, S804, S806, S808, and S810) coupled to the first voltage input (Vin/Vout), the voltage supply node N800 and the five capacitors 804-812. The remainder of the plurality of coupled switches comprises a second set of switches (S812, S814, S816, S818, S820, S822, S824, S826, S828, S830, S832, S834, S836) that includes a subset of the switches (S816, S818, S820, S822, S824, S826, S828, S830, S832, S834, S836) that are selectively controlled by the voltage scaling and gain control signal (h, m, l) provided by the comparator and logic circuit 1200 and at least the control signals $C_S$ and $C_D$ provided by the finite state machine 1202. The second set of switches (S812-S836) is coupled to the second voltage input (vref), the third voltage input (−vref), the voltage supply node N800, the five capacitors 804-812, and the non-inverting input at node N802 and the output (at Vout) of the operational amplifier 802. Each switch has at least first and second terminals and can be implemented using any suitable transistor technology including, but not limited to, MOSFET technology.

The connectivity of the switches within this illustrative switched capacitor circuit is as follows. The first terminal of switch S800 is coupled to the first voltage input (Vin/Vout), and the second terminal is coupled to the node N808. The first terminal of switch S802 is coupled to the first voltage input (Vin/Vout), and the second terminal is coupled to the node N810. The first terminal of switch S804 is coupled to the first voltage input (Vin/Vout), and the second terminal is coupled to the node N812. The first terminal of switch S806 is coupled to the voltage supply node, and the second terminal is coupled to the node N814. The first terminal of switch S808 is coupled to the voltage supply node, and the second terminal is coupled to the node N816. The first terminal of switch S810 is coupled to the voltage supply node, and the second terminal is coupled to the node N806. The first terminal of switch S812 is coupled to the node N808, and the second terminal is coupled to the output of the operational amplifier 802 at the node N804. The first terminal of switch S814 is coupled to the node N806, and the second terminal is coupled to the non-inverting input of the operational amplifier 802 at the node N802. The first terminal of switch S816 is coupled to the output ($V_{out1}$), and the second terminal is coupled to the node N810. The first terminal of switch S820 is coupled to the second voltage input (vref), and the second terminal is coupled to the node N810. The first terminal of switch S818 is coupled to the output ($V_{out1}$), and the second terminal is coupled to the node N812. The first terminal of switch S822 is coupled to the voltage supply node, and the second terminal is coupled to the node N812. The first terminal of switch S824 is coupled to the second voltage input (vref), and the second terminal is coupled to the node N812. The first terminal of switch S826 is coupled to the third voltage input (−vref), and the second terminal is coupled to the node N814. The first terminal of switch S828 is coupled to the voltage supply node, and the second terminal is coupled to the node N814. The first terminal of switch S830 is coupled to the second voltage input (vref), and the second terminal is coupled to the node N814. The first terminal of switch S832 is coupled to the third voltage input (−vref), and the second terminal is coupled to the node N816. The first terminal of switch S834 is coupled to the voltage supply node, and the second terminal is coupled to the node N816. The first terminal of switch S836 is coupled to the second voltage input (vref), and the second terminal is coupled to the node N816.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S800-S810 (also referred to herein as sampling control switches) is governed by a sampling control clock signal p1. The second set of switches S812-S836 (also referred to herein as gain control switches) is governed by a gain control clock signal p2. In addition, the gain control switches may be labeled with an "S" or "D". More particularly, a gain control switch labeled with only an "S" is controlled to close only when the control signal $C_S$ (FIG. 12) is high and is used only when operating on a single ended input voltage. A gain control switch labeled with only a "D" is controlled to close only when the controls signal $C_D$ (FIG. 12) is high and is used only when operating on a differential input voltage. A gain control switch labeled with both an "S" and a "D" is used when operating on either a single ended or differential input voltage, depending on the particular control signal (h, m, l) applied to the switch. A gain control switch having no "S" or "D" label is used when operating on either a single ended or differential input voltage.

Moreover, the subset (S822-S836) of the switches is governed by control signals h, m, and l as follows. Switch S822 is controlled to close by control signal l when operating on a single ended signal. Switch S824 is controlled to close by control signals h or m when operating on a single ended signal. Switch S826 is controlled to close by control signal l when operating on a differential signal. Switch S828 is controlled to close by control signal m when operating on a differential signal and by control signal l when operating on a single ended signal. Switch S830 is controlled to close by control signal h when operating on either a single ended or differential signal. Switch S832 is controlled to close by control signal l when operating on a differential signal. Switch S834 is controlled to close by control signal m when operating on a single ended signal. Switch S836 is controlled to close by control signal h when operating on a differential signal.

During operation of the initial ADC stage 820, during the same main clock period in which the comparator and digital circuit 1200 generates the initial output bit, the first set of switches (S800-S810) is configured to close under the control of the sampling control clock signal p1 during the sample cycle to charge the capacitors 804-808 in order to sample an unscaled input voltage at the first voltage input (Vin/Vout), thereby generating an unscaled input voltage sample. Upon the conclusion of the sample cycle when control signal p1 controls the first set of switches to open, the second set of switches (S812-S836) is configured to selectively close under the control of the gain control clock signal p2, the voltage scaling and gain control signal (h, m, or l) generated by the comparator and logic circuit 1200 during the initial main clock period that initiated the ADC process, and the control signal ($C_S$ or $C_D$) provided by the finite stage machine 1202, to scale the unscaled input voltage sample and the reference voltage and generate the initial residue voltage based on the comparison of the magnitude of the unscaled input voltage to the first upper and lower unscaled voltage trip points (e.g., as shown in diagram 1000 or 1010 of FIG. 10, depending on whether the unscaled input voltage comprises a single ended or differential input voltage).

In the illustrative circuit arrangement 820, during the initial residue calculation phase and when the unscaled input voltage comprises a single ended input voltage, the switched capacitor circuit generates the initial residue voltage at the node N804 having a magnitude determined by and in accordance with the sets of equations (7), (8), and (9) above. When the unscaled input voltage comprises a differential input voltage, the switched capacitor circuit generates the initial residue voltage at the node N804 having a magnitude determined by and in accordance with the sets of equations (10), (11), and (12) above. The residue voltage is provided to the next ADC stage 830 or to the multiplexer 840, depending on the implementation.

As mentioned earlier, any of circuits 620-820 can be modified to enable a configuration from an initial ADC stage, in accordance to the present teachings, to a RSD ADC stage that does not perform input voltage scaling; FIG. 9 illustrates such a modification to circuit 820. FIG. 9 illustrates a circuit diagram of a cyclic ADC 900 having an initial ADC stage 920 performing input and reference voltage scaling and an initial residue voltage calculation in the same operation, in accordance with another embodiment. The ADC 920 operates on an unscaled analog input voltage that comprises either a single ended input voltage or a differential input voltage, during the initial residue calculation cycle. Thereafter, during subsequent residue calculation cycles, the ADC stage 920 is reconfigured using the control signal $C_R$ (FIG. 12) to receive a residue voltage at its input (labeled Vin/Vout) and to generate a next residue voltage at its output (labeled $V_{out1}$), without scaling the input voltage. The ADC stage 920 maintains this configuration until the next unscaled input voltage sample is taken, wherein the ADC stage 920 is reconfigured using the control signal $C_S$ or $C_D$ (FIG. 12), depending on whether the unscaled input signal was single ended or differential, to generate another initial residue voltage. The ADC 900 further includes a multiplexer 940 having a first input coupled to receive the analog input voltage Vin, a second input coupled to receive a residue voltage and an output coupled to the input of the ADC stage 920. The multiplexer 940 contains circuitry (such as one or more switches) to control whether the unscaled input voltage or a residue voltage is provided at the input of the ADC stage 920. In a single-stage cyclic ADC 900 embodiment, initial and subsequent residue voltages ($V_{out1}$) output by the ADC stage 920 are coupled to the second input of the multiplexer 940. In a two-stage cyclic ADC embodiment, the ADC 900 comprises a second ADC stage 930 that provides residue voltages $V_{out2}$ to the second input of the multiplexer 940. The ADC stage 930, in one embodiment, operates as a known 1.5 bit RSD ADC.

ADC stage 920 includes a comparator and logic circuit (not shown) that can be configured, as the comparator and logic circuit 1200 of FIG. 12, with upper and lower unscaled voltage trip points $V_{HS}$ and $V_{LS}$ or $V_{HD}$ and $V_{LD}$ (having values, for instance, as shown in diagram 1000 or 1010 of FIG. 10) prior to the initial residue calculation and configured with upper and lower residue voltage trip points $V_{HR}$ and $V_{LR}$ (having values, for instance, as shown in diagram 1020 of FIG. 10) for enabling the calculation of residue voltages. The ADC stage 920 further comprises a switched capacitor circuit 922 coupled to the comparator and logic circuit at a first voltage input (labeled as Vin/Vout) of the switched capacitor circuit.

The switched capacitor circuit 922 further includes: a second voltage input (labeled as vref) for receiving a reference voltage; a third voltage input (labeled as −vref) for receiving a negative reference voltage, a voltage supply node N900 which is coupled to a common mode voltage $V_{CM}$, which in some implementations is a voltage that is approximately in the middle of the operating range of the ADC stage 920); a voltage output (which is an output $V_{out1}$ of the ADC stage 920) at a node N904; a plurality of coupled switches and capacitors, with the connectivity of these elements described below; and an operational amplifier 902 having an inverting input coupled to ("at") the node N900, a non-inverting input at a node N902, and an output terminal coupled to (and serving as) the voltage output ($V_{out1}$) of the switched capacitor circuit, at the node N904. The plurality of coupled capacitors comprises five capacitors 904, 906, 908, 910, and 912, with four of the capacitors (906, 908, 910, and 912) having a same first capacitance value and the fifth capacitor 904 having twice the first capacitance value, and each having first and second terminals. As shown, all five capacitors have a first terminal coupled together at a node N906. The second terminal of the capacitor 904 is coupled to a node N908. The second terminal of the capacitor 906 is coupled to a node N910. The second terminal of the capacitor 908 is coupled to a node N912. The second terminal of the capacitor 910 is coupled to a node N914. The second terminal of the capacitor 912 is coupled to a node N916.

The plurality of coupled switches comprises a first set of switches (S900, S902, S904, S906, S908, and S910) coupled to the first voltage input (Vin/Vout), the voltage supply node N900 and the five capacitors 904-912. The remainder of the plurality of coupled switches comprises a second set of switches (S912, S914, S916, S918, S920, S922, S924, S926, S928, S930, S932, S934, S936, S938, and S940) that includes a subset of the switches (S912, S914, S916, S918, S920, S922, S924, S926, S928, S930, S932, S934, and S936) that are selectively controlled by the voltage scaling and gain control signal (h, m, l) provided by the comparator and logic circuit 1200 and control signal ($C_S$, $C_D$, $C_R$) provided by the finite state machine 1202. The second set of switches (S912-

S940) is coupled to the second voltage input (vref), the third voltage input (−vref), the voltage supply node S900, the five capacitors 904-912, and the non-inverting input at node N902 and the output (at $V_{out1}$) of the operational amplifier 902. Each switch has at least first and second terminals and can be implemented using any suitable transistor technology including, but not limited to, MOSFET technology.

The connectivity of the switches within this illustrative switched capacitor circuit is as follows. The first terminal of switch S900 is coupled to the first voltage input (Vin/Vout), and the second terminal is coupled to the node N908. The first terminal of switch S902 is coupled to the first voltage input (Vin/Vout), and the second terminal is coupled to the node N910. The first terminal of switch S904 is coupled to the first voltage input (Vin/Vout), and the second terminal is coupled to the node N912. The first terminal of switch S906 is coupled to the voltage supply node, and the second terminal is coupled to the node N914. The first terminal of switch S908 is coupled to the voltage supply node, and the second terminal is coupled to the node N916. The first terminal of switch S910 is coupled to the voltage supply node, and the second terminal is coupled to the node N906. The first terminal of switch S938 is coupled to the node N908, and the second terminal is coupled to the output of the operational amplifier 902 at the node N904. The first terminal of switch S940 is coupled to the node N906, and the second terminal is coupled to the non-inverting input of the operational amplifier 902 at the node N902. The first terminal of switch S912 is coupled to the output (Vout), and the second terminal is coupled to the node N910. The first terminal of switch S916 is coupled to the voltage supply node, and the second terminal is coupled to the node N910. The first terminal of switch S918 is coupled to the second voltage input (vref), and the second terminal is coupled to the node N910. The first terminal of switch S920 is coupled to the voltage supply node, and the second terminal is coupled to the node N912. The first terminal of switch S922 is coupled to the third voltage input (−vref), and the second terminal is coupled to the node N912. The first terminal of switch S924 is coupled to the second voltage input (vref), and the second terminal is coupled to the node N912. The first terminal of switch S926 is coupled to the third voltage input (−vref), and the second terminal is coupled to the node N914. The first terminal of switch S928 is coupled to the voltage supply node, and the second terminal is coupled to the node N914. The first terminal of switch S930 is coupled to the second voltage input (vref), and the second terminal is coupled to the node N914. The first terminal of switch S932 is coupled to the third voltage input (−vref), and the second terminal is coupled to the node N916. The first terminal of switch S934 is coupled to the voltage supply node, and the second terminal is coupled to the node N916. The first terminal of switch S936 is coupled to the second voltage input (vref), and the second terminal is coupled to the node N916.

Each of the plurality of coupled switches is further labeled by their respective governing clock signal (p1 or p2) or control signal (h, m, or l) that controls the opening and closing of the switch. During operation, when a clock or control signal is "high", the associated switch is closed; and when a clock or control signal is "low", the associated switch is open. More specifically, the first set of switches S900-S910 (also referred to herein as sampling control switches) is governed by a sampling control clock signal p1. The second set of switches S912-S940 (also referred to herein as gain control switches) is governed by a gain control clock signal p2. In addition, the gain control switches may be labeled with an "S", "D", or an "R". More particularly, a gain control switch labeled with only an "S" is controlled to close only when the control signal $C_S$ (FIG. 12) is high and is used only when operating on a single ended input voltage. A gain control switch labeled with only a "D" is controlled to close only when the control signal $C_D$ (FIG. 12) is high and is used only when operating on a differential input voltage. A gain control switch labeled with only an "R" is controlled to close only when the control signal $C_D$ (FIG. 12) is high and is used only when operating on a residue input voltage. A gain control switch labeled with a combination of an "S", "D" and/or "R" is used when operating either on a single ended, a differential or a residue input voltage, depending on the particular control signal (h, m, l) applied to the switch. A gain control switch having no "S", "D" or "R" is used during all residue calculation cycles.

Moreover, the subset (S920-S936) of the switches is governed by control signals h, m, and l as follows. Switch S920 is controlled to close by control signal l when operating on a single ended signal and by a control signal m when operating on a residue signal. Switch S922 is controlled to close by control signal l when operating on a residue signal. Switch S924 is controlled to close by control signal h when operating on a single ended signal or residue signal and by a control signal m when operating on a single ended signal. Switch S926 is controlled to close by control signal l when operating on a differential signal. Switch S928 is controlled to close by control signal m when operating a either single ended or differential and by control signal l when operating on a single ended signal. Switch S930 is controlled to close by control signal h when operating on either a single ended or differential signal. Switch S932 is controlled to close by control signal l when operating on a differential signal. Switch S934 is controlled to close by control signal m when operating on either a single ended or differential signal and by control signals l or h when operating on a single ended signal. Switch S936 is controlled to close by a control signal h when operating on a differential signal.

During operation as an initial ADC stage, circuit 920 functions as does the circuit 820 of FIG. 8, as described above and not repeated here for the sake of brevity. During operation after the initial residue calculation cycle, the first set of switches (S900-S910) is configured to close under the control of the sampling control clock signal p1 during the sample cycle to charge the capacitors 904-908 in order to sample a residue input voltage (either $V_{out1}$ or $V_{out2}$) at the first voltage input (Vin/Vout), thereby generating a residue input voltage sample. Upon the conclusion of the sample cycle when control signal p1 controls the first set of switches to open, the second set of switches (S912-S940) is configured to selectively close under the control of the gain control clock signal p2 and one or more control signals (h, m, l, or $C_R$) to generate an output residue voltage based on the comparison of the magnitude of the unscaled input voltage to the first upper and lower residue voltage trip points (e.g., as shown in diagram 1020 of FIG. 10). The magnitude of the output residue voltage is determined in accordance with the following equations: when Vin>Vh, Vout=2Vin−vref; when Vh>Vin>Vl, Vout=2Vin; and when Vin<Vl, Vout=2Vin+vref, wherein Vin is the magnitude of the residue input voltage, Vout is the magnitude of the output residue voltage, vref is a magnitude of the reference voltage, Vh is the upper residue voltage trip point, and Vl is the lower residue voltage trip point.

Figure 11:
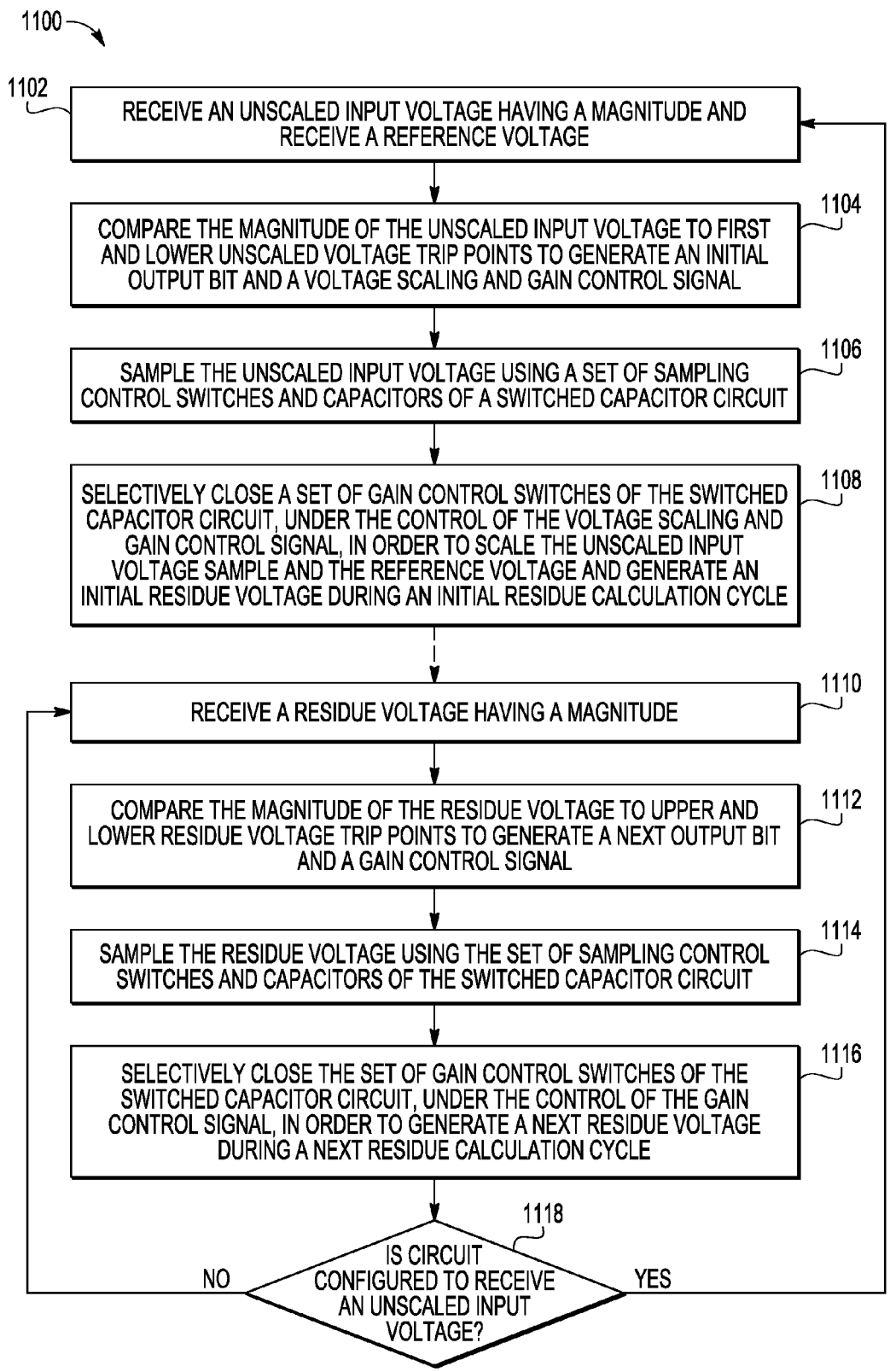
FIG. 11 is a flow diagram illustrating a method implemented in an ADC stage, in accordance with an embodiment.

Turning to FIG. 11, illustrated therein is a flow diagram of a method 1100 implemented in an ADC stage, in accordance with an embodiment. Method 1100 is performed, for example, by components of the initial ADC stages illustrated in FIG. 1 to FIG. 4 and FIG. 6 to FIG. 9. Where the ADC is configured as a pipelined ADC, the initial ADC performs only functions 1102-1108 of method 1100. When the ADC is configured as a cyclic ADC, the initial ADC performs the entire method 1100. In accordance with method 1100, a comparator and logic circuit of an initial ADC stage receives (1102) an unscaled input voltage having a magnitude and compares (1104) the magnitude of the unscaled input voltage to first upper and lower unscaled voltage trip points to generate an initial output bit corresponding to the magnitude of the unscaled input voltage, and to generate a voltage scaling and gain control signal for use in an initial residue calculation cycle of the plurality of residue calculation cycles, wherein the first upper and lower unscaled voltage trip points are different than upper and lower residue voltage trip points for use during the remainder of the plurality of residue calculation cycles. The initial ADC stage samples (1106) the unscaled input voltage using a set of sampling control switches and capacitors of a switched capacitor circuit within the initial ADC stage and selectively closes (1108) a set of gain control switches of the switched capacitor circuit, under the control of the voltage scaling and gain control signal, in order to scale the unscaled input voltage sample and generate an initial residue voltage during the initial residue calculation cycle.

In a further embodiment, the comparator and logic circuit of the initial ADC receives (1102) a reference voltage and selectively closes (1108) the set of gain control switches, under the control of the voltage scaling and gain control signal, in order to scale the reference voltage while scaling the unscaled input voltage sample and generating the initial residue voltage during the initial residue calculation cycle. Moreover, the method 1100 can be implemented for single ended or differential input signals. Accordingly, the first upper and lower unscaled voltage trip points have first upper and lower values when the unscaled input voltage comprises a single ended input voltage and have different upper and lower values when the unscaled input voltage comprises a differential input voltage.

In yet a further embodiment of the method 1100, an ADC stage is configurable after the initial residue calculation cycle to calculate a residue voltage without scaling the input signal. Upon being reconfigured, the comparator and logic circuit receives (1110) a residue voltage having a magnitude at a voltage input of the ADC stage, and compares (1112) the magnitude of the received residue voltage to the upper and lower residue voltage trip points to generate a next output bit corresponding to the magnitude of the received residue voltage, and to generate a gain control signal for use in a next residue calculation cycle of the plurality of residue calculation cycles. The switched capacitor circuit samples (1114) the residue voltage using the set of sampling control switches and capacitors of the switched capacitor circuit and selectively closes (1116) the set of gain control switches of the switched capacitor circuit, under the control of the gain control signal, in order to generate a next residue voltage during the next residue calculation cycle. At 1118, if gain control signal of the switched capacitor circuit are receiving the control signal $C_S$ or $C_D$, the ADC stage is configured to receive the unscaled input voltage and the method returns to block 1102. Otherwise, the method returns to block 1110.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the terms "configured to", "configured with", "arranged to", "arranged with", "capable of" and any like or similar terms mean that referenced circuit elements have an internal physical arrangement (such as by virtue of a particular transistor technology used) and/or physical coupling and/or connectivity with other circuit elements in an inactive state. This physical arrangement and/or physical coupling and/or connectivity (while in the inactive state) enables the circuit elements to perform stated functionality while in the active state of receiving and processing various signals at inputs of the circuit elements to generate signals at the output of the circuit elements. A device or structure that is "configured" in a certain way is configured in at least that way, but may also be configured in ways that are not listed.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The above description refers to nodes or features being "connected" or "coupled" together. As used here and, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment (assuming that the functionality of the given circuit is not adversely affected).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An analog-to-digital converter stage comprising:
    a comparator and logic circuit configured with first upper and lower unscaled voltage trip points and further configured, prior to an initial residue calculation cycle, to compare a magnitude of an unscaled input voltage to the first upper and lower unscaled voltage trip points, to generate an initial output bit corresponding to the magnitude of the unscaled input voltage, and to generate a voltage scaling and gain control signal;
    a switched capacitor circuit coupled to the comparator and logic circuit, the switched capacitor circuit comprising a first voltage input, a voltage output, and a plurality of coupled capacitors and switches configured to sample the unscaled input voltage at the first voltage input to generate an unscaled input voltage sample and to receive the voltage scaling and gain control signal for selectively controlling a subset of the switches in order to scale the unscaled input voltage sample and generate an initial residue voltage having an initial residue magnitude at the voltage output during the initial residue calculation cycle;
    a second voltage input for receiving a reference voltage;
    a voltage supply node for receiving a common mode voltage;
    an operational amplifier having an inverting input coupled to the voltage supply node and a non-inverting input and having an output terminal coupled to the voltage output of the switched capacitor circuit;
    wherein the plurality of coupled capacitors comprises four capacitors;
    wherein the plurality of coupled switches comprises a first set of switches coupled to the first voltage input, the voltage supply node and the four capacitors, wherein the first set of switches is configured to close under the control of a sampling control clock signal to charge at least a subset of the four capacitors in order to sample the unscaled input voltage at the first voltage input;
    wherein a remainder of the plurality of coupled switches comprises a second set of switches that comprises the subset of the switches, wherein the second set of switches is coupled to the second voltage input, the voltage supply node, the four capacitors, and the non-inverting input and the output of the operational amplifier.

2. The analog-to-digital converter stage of claim 1, wherein the comparator and logic circuit is configured with upper and lower residue voltage trip points that are different than the first upper and lower unscaled voltage trip points, and wherein the comparator and logic circuit is configured, after the initial residue calculation cycle, to compare a magnitude of a residue voltage at the first voltage input to the upper and lower residue voltage trip points to generate a next output bit and to generate a gain control signal for use in a next residue calculation cycle.

3. The analog-to-digital converter stage of claim 2, wherein the plurality of coupled capacitors and switches is configured, after the initial residue calculation cycle, to sample the residue voltage at the first voltage input and to receive the gain control signal for selectively controlling the subset of the switches to generate a next residue voltage during the next residue calculation cycle.

4. The analog-to-digital converter stage of claim 1, wherein:
    the comparator and logic circuit is configured with second upper and lower unscaled voltage trip points that are different than the first upper and lower unscaled voltage trip points;
    the comparator and logic circuit is configured to compare the magnitude of the unscaled input voltage to the first upper and lower unscaled voltage trip points to generate the initial output bit and the voltage scaling and gain control signal when the unscaled input voltage comprises a single ended input voltage;
    the comparator and logic circuit is configured to compare the magnitude of the unscaled input voltage to the second upper and lower unscaled voltage trip points to generate the initial output bit and the voltage scaling and gain control signal when the unscaled input voltage comprises a differential input voltage.

5. The analog-to-digital converter stage of claim 1, wherein the switched capacitor circuit further comprises a third voltage input, coupled to the second set of switches, for receiving a negative reference voltage.

6. The analog-to-digital converter stage of claim 5:
    wherein the second set of switches is configured to selectively close under the control of a gain control clock signal and the voltage scaling and gain control signal to scale the unscaled input voltage sample and generate the initial residue voltage in accordance with the following equations, when the unscaled input voltage comprises a single ended input voltage:

$$\text{when, } Vin > Vh$$
    $$Vout = 2Vin - 3vref;$$
    $$\text{when, } Vh > Vin > V1$$
    $$Vout = 2Vin - 2vref;$$
    $$\text{when, } Vin < V1$$
    $$Vout = 2Vin - vref,$$

wherein the second set of switches is configured to selectively close under the control of the gain control clock signal and the voltage scaling and gain control signal to scale the unscaled input voltage sample and generate the initial residue voltage in accordance with the following equations, when the unscaled input voltage comprises a differential input voltage:

when, $Vin > Vh$
$$Vout = 2\left(\frac{Vin}{2}\right) - vref;$$

when, $Vh > Vin > Vl$
$$Vout = 2\left(\frac{Vin}{2}\right);$$

when, $Vin < Vl$
$$Vout = 2\left(\frac{Vin}{2}\right) + vref,$$

wherein Vin is the magnitude of the unscaled input voltage, Vout is the initial residue magnitude, vref is a magnitude of the reference voltage, Vh is the upper unscaled voltage trip point, and Vl is the lower unscaled voltage trip point.

7. An analog-to-digital converter stage comprising:
a comparator and logic circuit configured with first upper and lower unscaled voltage trip points and further configured, prior to an initial residue calculation cycle, to compare a magnitude of an unscaled input voltage to the first upper and lower unscaled voltage trip points, to generate an initial output bit corresponding to the magnitude of the unscaled input voltage, and to generate a voltage scaling and gain control signal;
a switched capacitor circuit coupled to the comparator and logic circuit, the switched capacitor circuit comprising first voltage input, a voltage output, and a plurality of coupled capacitors and switches configured sample the unscaled input voltage at the first voltage input to generate an unscaled input voltage sample and to receive the voltage scaling and gain control signal for selectively controlling a subset of the switches in order to scale the unscaled input voltage sample and generate an initial residue voltage having an initial residue magnitude at the voltage output during the initial residue calculation cycle, wherein the switched capacitor circuit further comprises a second voltage input, coupled to some of the switches, for receiving a reference voltage, wherein the plurality of coupled capacitors and switches is configured to scale the reference voltage while scaling the unscaled input voltage sample and while generating the initial residue voltage during the initial residue calculation cycle.

8. The analog-to-digital converter stage of claim 7, wherein the switched capacitor circuit further comprises:
a voltage supply node for receiving a common mode voltage;
an operational amplifier having an inverting input coupled to the voltage supply node and a non-inverting input and having an output terminal coupled to the voltage output of the switched capacitor circuit;
wherein the plurality of coupled capacitors comprises four capacitors;
wherein the plurality of coupled switches comprises a first set of switches coupled to the first voltage input, the voltage supply node and the capacitors, wherein the first set of switches is configured to close under the control of a sampling control clock signal to charge at least a subset of the capacitors in order to sample the unscaled input voltage at the first voltage input;
wherein a remainder of the plurality of coupled switches comprises a second set of switches that comprises the subset of the switches, wherein the second set of switches is coupled to the second voltage input, the voltage supply node, the capacitors, and the non-inverting input and the output of the operational amplifier.

9. The analog-to-digital converter stage of claim 8:
wherein the switched capacitor circuit further comprises a third voltage input, coupled to the second set of switches, for receiving a negative reference voltage;
wherein the plurality of coupled capacitors comprises a fifth capacitor coupled to the first and second sets of switches.

10. The analog-to-digital converter stage of claim 9:
wherein the second set of switches is configured to selectively close under the control of a gain control clock signal and the voltage scaling and gain control signal to scale the unscaled input voltage sample and the reference voltage and generate the initial residue voltage in accordance with the following equations, when the unscaled input voltage comprises a single ended input voltage:

when, $Vin > Vh$
$$Vout = 2\left(Vin - \frac{vref}{2}\right) - \frac{vref}{2};$$

when, $Vh > Vin > Vl$
$$Vout = 2\left(Vin - \frac{vref}{2}\right);$$

when, $Vin < Vl$
$$Vout = 2\left(Vin - \frac{vref}{2}\right) + \frac{vref}{2},$$

wherein the second set of switches is configured to selectively close under the control of the gain control clock signal and the voltage scaling and gain control signal to scale the unscaled input voltage sample and the reference voltage and generate the initial residue voltage in accordance with the following equations, when the unscaled input voltage comprises a differential input voltage:

when, $Vin > Vh$
$$Vout = 2\left(\frac{Vin}{2}\right) - vref;$$

when, $Vh > Vin > Vl$
$$Vout = 2\left(\frac{Vin}{2}\right);$$

when, $Vin < Vl$
$$Vout = 2\left(\frac{Vin}{2}\right) + \frac{vref}{2},$$

wherein Vin is the magnitude of the unscaled input voltage, Vout is the initial residue magnitude, vref is a magnitude of the reference voltage, Vh is the upper unscaled voltage trip point, and Vl is the lower unscaled voltage trip point.

11. A method for use in an analog-to-digital conversion process comprising a plurality of residue calculation cycles, the method comprising:
receiving an unscaled input voltage, having a magnitude, into a comparator and logic circuit configured with first upper and lower unscaled voltage trip points and into a first voltage input of a switched capacitor circuit within an analog-to-digital converter stage, wherein the switched capacitor circuit also has a second voltage input and a voltage output;

comparing the magnitude of the unscaled input voltage to the first upper and lower unscaled voltage trip points to generate an initial output bit corresponding to the magnitude of the unscaled input voltage and to generate a voltage scaling and gain control signal for use in an initial residue calculation cycle of the plurality of residue calculation cycles;

sampling the unscaled input voltage using a set of sampling control switches and capacitors of the switched capacitor circuit;

selectively closing a set of gain control switches of the switched capacitor circuit, under the control of the voltage scaling and gain control signal, in order to scale the unscaled input voltage sample and generate an initial residue voltage at the voltage output during the initial residue calculation cycle;

receiving a reference voltage into a second voltage input;

selectively closing the set of gain control switches, under the control of the voltage scaling and gain control signal, in order to scale the reference voltage while scaling the unscaled input voltage sample and generating the initial residue voltage during the initial residue calculation cycle.

12. The method of claim 11 further comprising:

receiving a negative reference voltage into a third voltage input of the switched capacitor network, wherein the negative reference voltage is used to generate the initial residue voltage.

13. The method of claim 12 comprising:

receiving a residue voltage having a magnitude at a voltage input of the switched capacitor circuit;

comparing the magnitude of the residue voltage at the voltage input to the upper and lower residue voltage trip points to generate a next output bit corresponding to the magnitude of the residue voltage at the voltage input and to generate a gain control signal for use in a next residue calculation cycle of the plurality of residue calculation cycles;

sampling the residue voltage at the voltage input using the set of sampling control switches and capacitors of the switched capacitor circuit;

selectively closing the set of gain control switches of the switched capacitor circuit, under the control of the gain control signal, in order to generate a next residue voltage during the next residue calculation cycle.

14. The method of claim 11, wherein the first upper and lower unscaled voltage trip points are different than upper and lower residue voltage trip points for use during the remainder of the plurality of residue calculation cycles.

* * * * *

UNITED STATES PATENT AND TRADEMARK OFFICE
CERTIFICATE OF CORRECTION

PATENT NO. : 8,823,566 B2  
APPLICATION NO. : 13/537308  
DATED : September 2, 2014  
INVENTOR(S) : Ahmad H Atriss et al.

Page 1 of 1

It is certified that error appears in the above-identified patent and that said Letters Patent is hereby corrected as shown below:

in the claims in claim 7, column 37, line 31; the word "to" should be between the words "configured" and "sample"

Signed and Sealed this
Twenty-fourth Day of May, 2016

Michelle K. Lee
*Director of the United States Patent and Trademark Office*